United States Patent
Larson, III et al.

(10) Patent No.: US 7,332,985 B2
(45) Date of Patent: Feb. 19, 2008

(54) CAVITY-LESS FILM BULK ACOUSTIC RESONATOR (FBAR) DEVICES

(75) Inventors: John D Larson, III, Palo Alto, CA (US); Stephen Ellis, Pleasanton, CA (US); Paul A. Bradley, Mountain View, CA (US); Yury Oshmyansky, Laguna Beach, CA (US)

(73) Assignee: Avago Technologies Wireless IP (Singapore) Pte Ltd., Singapore (SG)

( * ) Notice: Subject to any disclaimer, the term of this patent is extended or adjusted under 35 U.S.C. 154(b) by 84 days.

(21) Appl. No.: 10/969,744

(22) Filed: Oct. 19, 2004

(65) Prior Publication Data

US 2005/0104690 A1 May 19, 2005

Related U.S. Application Data

(63) Continuation-in-part of application No. 10/965,541, filed on Oct. 13, 2004, and a continuation-in-part of application No. 10/965,637, filed on Oct. 13, 2004, and a continuation-in-part of application No. 10/699,289, filed on Oct. 30, 2003, now Pat. No. 7,019,605, and a continuation-in-part of application No. 10/699,481, filed on Oct. 30, 2003, now Pat. No. 6,946,928.

(51) Int. Cl.
*H03H 9/54* (2006.01)
*H03H 9/60* (2006.01)

(52) U.S. Cl. .................. 333/187; 333/189; 333/192

(58) Field of Classification Search ........ 333/187–189, 333/133
See application file for complete search history.

(56) References Cited

U.S. PATENT DOCUMENTS 3,174,122 A    3/1965    Fowler et al.
3,321,648 A    5/1967    Kolm
3,422,371 A    1/1969    Poirier et al.
3,568,108 A    3/1971    Poirier et al.
3,582,839 A    6/1971    Pim et al.
3,590,287 A    6/1971    Berlincourt et al.
3,610,969 A    10/1971   Clawson et al.

(Continued)

FOREIGN PATENT DOCUMENTS

DE    101 60 617 A1 *    6/2003

(Continued)

OTHER PUBLICATIONS

Lakin K.M., "Bulk Acoustic Wave Coupled Resonator Filters", IEEE International Frequency Control Symposium and PDA Exhibition, 2002, pp. 8-14, May 29-31, 2002.

(Continued)

*Primary Examiner*—Barbara Summons

(57) ABSTRACT

The film bulk acoustic resonator (FBAR) device comprises a substrate, an acoustic Bragg reflector over the substrate, a piezoelectric element over the acoustic Bragg reflector, and a remote-side electrode over the piezoelectric element. The acoustic Bragg reflector comprises a metal Bragg layer juxtaposed with a plastic Bragg layer. The large ratio between the acoustic impedances of the plastic material of the plastic Bragg layer and the metal of the metal Bragg layer provides sufficient acoustic isolation between the FBAR and the substrate for the frequency response of the FBAR device to exhibit minor, if any, spurious artifacts arising from undesirable acoustic coupling between the FBAR and the substrate.

29 Claims, 13 Drawing Sheets

U.S. PATENT DOCUMENTS

| | | | |
|---|---|---|---|
| 3,826,931 A | 7/1974 | Hammond | |
| 3,845,402 A | 10/1974 | Nupp | |
| 4,084,217 A | 4/1978 | Brandis et al. | |
| 4,172,277 A | 10/1979 | Pinson | |
| 4,272,742 A | 6/1981 | Lewis | |
| 4,281,299 A | 7/1981 | Newbold | |
| 4,320,365 A | 3/1982 | Black et al. | |
| 4,355,408 A | 10/1982 | Scarrott | |
| 4,456,850 A | 6/1984 | Inoue et al. | |
| 4,529,904 A | 7/1985 | Hattersley | |
| 4,625,138 A | 11/1986 | Ballato | |
| 4,719,383 A | 1/1988 | Wang et al. | |
| 4,798,990 A | 1/1989 | Henoch | |
| 4,836,882 A | 6/1989 | Ballato | |
| 4,841,429 A | 6/1989 | McClanahan et al. | |
| 4,906,840 A | 3/1990 | Zdeblick et al. | |
| 5,048,036 A | 9/1991 | Scifres et al. | |
| 5,048,038 A | 9/1991 | Brennan et al. | |
| 5,118,982 A | 6/1992 | Inoue et al. | |
| 5,129,132 A | 7/1992 | Zdeblick et al. | |
| 5,162,691 A | 11/1992 | Mariani et al. | |
| 5,241,209 A | 8/1993 | Sasaki | |
| 5,241,456 A | 8/1993 | Marcinkiewicz et al. | |
| 5,294,898 A | 3/1994 | Dworsky et al. | |
| 5,382,930 A | 1/1995 | Stokes et al. | |
| 5,448,014 A | 9/1995 | Kong et al. | |
| 5,465,725 A | 11/1995 | Seyed-Bolorforosh | |
| 5,587,620 A | 12/1996 | Ruby et al. | 310/346 |
| 5,589,858 A | 12/1996 | Kadowaki et al. | |
| 5,671,242 A | 9/1997 | Takiguchi et al. | |
| 5,692,279 A | 12/1997 | Mang et al. | |
| 5,714,917 A | 2/1998 | Ella | |
| 5,853,601 A | 12/1998 | Krishaswamy et al. | |
| 5,864,261 A | 1/1999 | Weber | 333/187 |
| 5,872,493 A | 2/1999 | Ella | |
| 5,873,153 A | 2/1999 | Ruby et al. | |
| 5,873,154 A * | 2/1999 | Ylilammi et al. | 29/25.35 |
| 5,910,756 A | 6/1999 | Ella | |
| 5,936,150 A | 8/1999 | Kobrin et al. | |
| 5,953,479 A | 9/1999 | Zhou et al. | |
| 6,040,962 A | 3/2000 | Kanazawa | |
| 6,060,818 A | 5/2000 | Ruby et al. | |
| 6,087,198 A * | 7/2000 | Panasik | 438/51 |
| 6,107,721 A | 8/2000 | Lakin | 310/321 |
| 6,111,480 A | 8/2000 | Iyama et al. | |
| 6,150,703 A | 11/2000 | Cushman et al. | |
| 6,187,513 B1 | 2/2001 | Katakura | |
| 6,215,375 B1 | 4/2001 | Larson, III et al. | 333/187 |
| 6,228,675 B1 | 5/2001 | Ruby et al. | |
| 6,229,247 B1 | 5/2001 | Bishop | |
| 6,252,229 B1 | 6/2001 | Hays et al. | |
| 6,262,637 B1 | 7/2001 | Bradley et al. | 333/133 |
| 6,265,246 B1 | 7/2001 | Ruby et al. | |
| 6,278,342 B1 | 8/2001 | Ella | |
| 6,292,336 B1 | 9/2001 | Horng | |
| 6,307,447 B1 | 10/2001 | Barber et al. | |
| 6,307,761 B1 | 10/2001 | Nakagawa | |
| 6,466,418 B1 | 2/2002 | Horng | |
| 6,376,280 B1 | 4/2002 | Ruby et al. | |
| 6,377,137 B1 | 4/2002 | Ruby | |
| 6,384,697 B1 | 5/2002 | Ruby | |
| 6,407,649 B1 | 6/2002 | Tikka et al. | |
| 6,414,569 B1 | 7/2002 | Nakafuku | |
| 6,420,820 B1 | 7/2002 | Larson, III | |
| 6,424,237 B1 | 7/2002 | Ruby et al. | |
| 6,429,511 B2 | 8/2002 | Ruby et al. | |
| 6,434,030 B1 | 8/2002 | Rehm et al. | |
| 6,437,482 B1 | 8/2002 | Shibata | |
| 6,441,539 B1 | 8/2002 | Kitamura et al. | |
| 6,462,631 B2 | 10/2002 | Bradley et al. | |
| 6,466,105 B1 | 10/2002 | Lobl et al. | 333/187 |
| 6,469,597 B2 | 10/2002 | Ruby et al. | |
| 6,472,954 B1 | 10/2002 | Ruby et al. | |
| 6,476,536 B1 | 11/2002 | Pensala | |
| 6,479,320 B1 | 11/2002 | Gooch | |
| 6,483,229 B2 | 11/2002 | Larson, III et al. | |
| 6,489,688 B1 | 12/2002 | Baumann et al. | |
| 6,492,883 B2 | 12/2002 | Liang et al. | |
| 6,507,983 B1 | 1/2003 | Ruby et al. | |
| 6,518,860 B2 | 2/2003 | Ella | |
| 6,525,996 B1 | 2/2003 | Miyazawa | |
| 6,530,515 B1 | 3/2003 | Glenn et al. | |
| 6,534,900 B2 | 3/2003 | Aigner et al. | |
| 6,542,055 B1 | 4/2003 | Frank et al. | |
| 6,548,942 B1 | 4/2003 | Panasik | |
| 6,550,664 B2 | 4/2003 | Bradley et al. | |
| 6,564,448 B1 | 5/2003 | Oura et al. | |
| 6,566,979 B2 | 5/2003 | Larson et al. | |
| 6,583,374 B2 | 6/2003 | Knieser et al. | |
| 6,583,688 B2 | 6/2003 | Klee et al. | |
| 6,593,870 B2 | 7/2003 | Dummermuth et al. | |
| 6,600,390 B2 | 7/2003 | Frank | |
| 6,601,276 B2 | 8/2003 | Barber | |
| 6,617,249 B2 | 9/2003 | Ruby et al. | |
| 6,617,750 B2 | 9/2003 | Dummermuth et al. | |
| 6,630,753 B2 | 10/2003 | Malik et al. | |
| 6,635,509 B1 | 10/2003 | Ouellet | |
| 6,651,488 B2 | 11/2003 | Larson et al. | |
| 6,657,363 B1 | 12/2003 | Aigner | |
| 6,668,618 B2 | 12/2003 | Larson et al. | |
| 6,670,866 B2 | 12/2003 | Ella et al. | 333/133 |
| 6,693,500 B2 | 2/2004 | Yang et al. | |
| 6,710,508 B2 | 3/2004 | Ruby et al. | |
| 6,710,681 B2 | 3/2004 | Figueredo et al. | |
| 6,714,102 B2 | 3/2004 | Ruby et al. | |
| 6,720,844 B1 | 4/2004 | Lakin | |
| 6,720,846 B2 | 4/2004 | Iwashita et al. | |
| 6,724,266 B2 | 4/2004 | Piazza et al. | |
| 6,777,263 B1 | 8/2004 | Gan et al. | |
| 6,787,048 B2 | 9/2004 | Bradley et al. | |
| 6,788,170 B1 | 9/2004 | Kaitila et al. | |
| 6,803,835 B2 | 10/2004 | Frank | |
| 6,812,619 B1 | 11/2004 | Kaitila et al. | |
| 6,828,713 B2 | 12/2004 | Bradley et al. | |
| 6,842,088 B2 | 1/2005 | Yamada et al. | |
| 6,873,529 B2 | 3/2005 | Ikuta et al. | |
| 6,874,211 B2 | 4/2005 | Bradley et al. | |
| 6,874,212 B2 | 4/2005 | Larson, III | |
| 6,888,424 B2 | 5/2005 | Takeuchi et al. | |
| 6,900,705 B2 | 5/2005 | Nakamura et al. | |
| 6,903,452 B2 | 6/2005 | Ma et al. | |
| 6,906,451 B2 | 6/2005 | Yamada et al. | |
| 6,911,708 B2 | 6/2005 | Park | |
| 6,917,261 B2 | 7/2005 | Unterberger | |
| 6,924,583 B2 | 8/2005 | Lin et al. | |
| 6,924,717 B2 | 8/2005 | Ginsburg et al. | |
| 6,927,651 B2 | 8/2005 | Larson, III et al. | |
| 6,936,928 B2 | 8/2005 | Hedler et al. | |
| 6,936,954 B2 | 8/2005 | Peczalski | |
| 6,946,928 B2 * | 9/2005 | Larson et al. | 333/189 |
| 6,954,121 B2 | 10/2005 | Bradley et al. | |
| 6,963,257 B2 | 11/2005 | Ella et al. | |
| 6,975,183 B2 | 12/2005 | Aigner et al. | |
| 6,977,563 B2 | 12/2005 | Komuro et al. | |
| 6,985,052 B2 | 1/2006 | Tikka | |
| 6,987,433 B2 | 1/2006 | Larson et al. | |
| 6,989,723 B2 | 1/2006 | Komuro et al. | |
| 6,998,940 B2 | 2/2006 | Metzger | |
| 7,019,604 B2 | 3/2006 | Gotoh et al. | |
| 7,019,605 B2 * | 3/2006 | Larson, III | 333/187 |
| 7,057,476 B2 | 6/2006 | Hwu | |
| 7,084,553 B2 | 8/2006 | Ludwiczak | |
| 7,091,649 B2 | 8/2006 | Larson et al. | |
| 7,098,758 B2 | 8/2006 | Wang et al. | |

| | | |
|---|---|---|
| 7,170,215 B2 | 1/2007 | Namba et al. |
| 7,173,504 B2 | 2/2007 | Larson |
| 7,187,254 B2 | 3/2007 | Su et al. |
| 7,230,509 B2 | 6/2007 | Stoemmer |
| 2002/0000646 A1 | 1/2002 | Gooch et al. |
| 2002/0030424 A1 | 3/2002 | Iwata |
| 2002/0121944 A1 | 9/2002 | Larson, III et al. |
| 2002/0121945 A1 | 9/2002 | Ruby et al. |
| 2002/0152803 A1 | 10/2002 | Larson, III et al. |
| 2002/0190814 A1 | 12/2002 | Yamada et al. |
| 2003/0001252 A1 | 1/2003 | Cheever et al. |
| 2003/0006502 A1 | 1/2003 | Karpman |
| 2003/0087469 A1 | 5/2003 | Ma |
| 2003/0102776 A1 | 6/2003 | Takeda et al. |
| 2003/0111439 A1 | 6/2003 | Fetter et al. |
| 2003/0128081 A1 | 7/2003 | Ella et al. .......... 333/133 |
| 2003/0132493 A1 | 7/2003 | Kang et al. |
| 2003/0141946 A1 | 7/2003 | Ruby et al. |
| 2003/0179053 A1 | 9/2003 | Aigner et al. |
| 2004/0124952 A1 | 7/2004 | Tikka |
| 2004/0150293 A1 | 8/2004 | Stoemmer |
| 2004/0150296 A1 | 8/2004 | Park et al. |
| 2004/0195937 A1 | 10/2004 | Matsubara et al. |
| 2004/0257172 A1 | 12/2004 | Schmidhammer et al. |
| 2004/0263287 A1 | 12/2004 | Ginsburg et al. |
| 2005/0012570 A1 | 1/2005 | Korden et al. |
| 2005/0023931 A1 | 2/2005 | Bouche et al. |
| 2005/0030126 A1 | 2/2005 | Inoue et al. |
| 2005/0057117 A1 | 3/2005 | Nakatsuka et al. |
| 2005/0057324 A1 | 3/2005 | Onishi et al. |
| 2005/0068124 A1* | 3/2005 | Stoemmer .......... 333/189 |
| 2005/0093396 A1 | 5/2005 | Larson et al. |
| 2005/0093653 A1 | 5/2005 | Larson, III |
| 2005/0093654 A1 | 5/2005 | Larson, III et al. |
| 2005/0093655 A1 | 5/2005 | Larson et al. |
| 2005/0093657 A1 | 5/2005 | Larson et al. |
| 2005/0093658 A1 | 5/2005 | Larson, III et al. |
| 2005/0093659 A1 | 5/2005 | Larson, III et al. |
| 2005/0110598 A1 | 5/2005 | Larson, III |
| 2005/0128030 A1 | 6/2005 | Larson et al. |
| 2005/0140466 A1 | 6/2005 | Larson III, et al. |
| 2005/0104690 A1 | 8/2005 | Larson et al. |
| 2005/0167795 A1 | 8/2005 | Higashi |
| 2005/0193057 A1 | 9/2005 | Ludwiczak |
| 2005/0206271 A1 | 9/2005 | Higuchi et al. |
| 2005/0218488 A1 | 10/2005 | Mie |
| 2006/0087199 A1 | 4/2006 | Larson et al. |
| 2006/0103492 A1 | 5/2006 | Feng et al. |
| 2006/0132262 A1 | 6/2006 | Fazzlo et al. |
| 2006/0164183 A1 | 7/2006 | Tikka |
| 2006/0185139 A1 | 8/2006 | Larson III, et al. |
| 2007/0085447 A1 | 4/2007 | Larson |
| 2007/0085631 A1 | 4/2007 | Larson et al. |
| 2007/0085632 A1 | 4/2007 | Larson et al. |
| 2007/0086080 A1 | 4/2007 | Larson et al. |
| 2007/0086274 A1 | 4/2007 | Nishimura et al. |
| 2007/0090892 A1 | 4/2007 | Larson |
| 2007/0170815 A1 | 7/2007 | Unkrich |
| 2007/0171002 A1 | 7/2007 | Unkrich |

FOREIGN PATENT DOCUMENTS

| | | |
|---|---|---|
| EP | 0865157 | 9/1996 |
| EP | 0 880 227 | 11/1998 |
| EP | 1 047 189 | 4/1999 |
| EP | 0973256 | 1/2000 |
| EP | 1 100 196 | 5/2001 |
| EP | 1096259 | 5/2001 |
| EP | 1100106 A2 | 5/2001 |
| EP | 1258990 | 11/2002 |
| EP | 1180494 | 3/2003 |
| EP | 1 542 362 | 6/2003 |
| EP | 1 557 945 | 10/2003 |
| EP | 1258989 | 1/2004 |
| EP | 1528674 | 6/2004 |
| EP | 1528675 | 6/2004 |
| EP | 1528677 | 7/2004 |
| EP | 1 517 444 | 8/2004 |
| EP | 1249932 | 3/2005 |
| EP | 1517443 | 3/2005 |
| EP | 1575165 | 9/2005 |
| GB | 1207974 | 11/1967 |
| GB | 2411239 | 8/2005 |
| GB | 2418791 | 4/2006 |
| JP | 2002-217676 | 8/2002 |
| WO | WO98/16957 | 4/1998 |
| WO | WO-01/06647 | 1/2001 |
| WO | WO-01/99276 | 12/2001 |
| WO | WO-02/103900 | 12/2002 |
| WO | WO-03/043188 | 5/2003 |
| WO | WO 03/050950 | 6/2003 |
| WO | WO 03/058809 | 7/2003 |
| WO | WO 2003/05880 | 7/2003 |
| WO | WO 03/030358 | 10/2003 |
| WO | WO-2004/051744 | 6/2004 |
| WO | WO 2004/034579 | 8/2004 |
| WO | WO-2005/043752 | 5/2005 |
| WO | WO-2005/043753 | 5/2005 |
| WO | WO-2005/043756 | 5/2005 |

OTHER PUBLICATIONS

Search report from corresponding application No. GB0605779.8 dated Aug. 23, 2006.

Martin, et al., "Development of Low-Dielectric Constant Polymer for Fabrication of Integrated Circuit Interconnect", 12 Advanced Materials, pp. 1769-1778 (2000).

Krishnaswamy, S.V., et al., "Film Bulk Acoustic Wave Resonator Technology", Ultrasonic Symposium, 1990, pp. 529-536.

B. Hadimioglu et al., "Polymer Files as Acoustic Matching Layers", 1990 IEEE Ultrasonics Sysmposium Proceedings, vol. 3 pp. 1337-1340, Dec. 1990.

Jung, Jun-Phil, "Experimental and Theoretical (INvestigation on the Relationship between AIN Properties and AIN-based FBAR Characterisitics", IEEE Internations Frequancy Control Symposium, May 4, 2003, pp. 779-784.

Lobl, H.P., et al., "Piezoelectric Material for BAW Resonators and Filters", IEEE Ultrasonics Symposium Oct. 5, 2003, pp. 807-811.

Reinhardt, Alexandre et al., "Piezoelectric Material for BAW Resonators and Filters", IEEE Ultrasonics Symposium Oct. 5, 2003, pp. 807-811.

Yang, C.-M., Highly C-Axis-Oriented AIN Film Using MOCVD for 5GHz-Band FBAR Filter, IEEE Ultrasonics Symposium, Oct. 5, 2003, 99. 170-173.

Examination Report corresponding to application No. GB0605770.7 dated Aug. 25, 2006.

Examination Report from corresponding application number GB0605971.1 dated Aug. 24, 2006.

Examination Report corresponding to application No. GB060775.6 dated Aug. 30, 2006.

Reinhardt, Alexandre et al., "Design of Coupled Resonator Filters Using Admittance and Scattering Malrices", 2003 IEEE Ultrasonics Symposium, (May 3, 2003). 1428-1431 (Previously submittedas Reinhardt, Alexandre et al. "Piezoelectric Material for BAW Resonators and Filters", IEEE Ultrasonics Symposium Oct. 5, 2003, pp. 807-811 Considered by Examiner on Mar. 20, 2007).

Holzlohner, Ronald et al., "Accurate Calculation of Eye Diagrams and Bit Error Rates in Optical Transmission Systems Using Lineanzation", Journal of Lightwave Technology, vol. 20, No. 3, (Mar. 2002). pp. 389-400.

Lakin, K.M. "Couples Resonator Filters", 2002 IEEE Ultrasonics Symposium, (Mar. 2, 2002), 901-908.

Lakin, K.M. et al., "High Performance Stacked Crystal Filters for GPS and Wide Bandwidth Applications", 2001 IEEE Ultrasonics Symposium, (Jan. 1, 2001), 833-838.

B. Hadimioglu, et al, "Polymer Films as Acoustic Matching Layers". 1990 IEEE Ultrasonics Symposium Procedding. vol. 3 pp. 1337-1340, Dec. 1990 (Previously submitted as "Polymer Filies as Acoustic Matching Layers, 1990 IEEE Ultrasonics Symposium Proceeding, vol. 4 pp. 1227-1340, Dec. 1990", Considered by Examiner on Mar. 20, 2007).

U.S. Appl. No. 10/971169, filed Oct. 22, 2004, Larson III, John D. et al.

"Search report from corresponding application No.", GB0620152.9, (Nov. 15, 2006).

"Search report from corresponding application No. ", GB0620655.1, (Nov. 17, 2006).

"Search report from corresponding application No. ", GB0620653.6, (Nov. 17, 2006).

"Search Report from corresponding application No. ", GB0620657.7, (Nov. 23, 2006).

Coombs, Clyde F., et al., "Electronic Instrument Handbook", Second Edition, McGraw-Hill, Inc., (1995), pp. 5.1 to 5.29.

"A partial copy of GB Search Report for", Application No. GB0522393.8, (Jan. 9, 2006), 4 pages.

"A partial copy GB Search Report for Application No. ", GB0525884.3, (Feb. 2, 2006), 4 pgs.

Auld, B. A., "Acoustic Resonators", *Acoustic Fields and Waves in Solids, Second Edition*, vol. II, (1990),250-259.

"British Search Report Application No. ", 0605222.9, (Jul. 11, 2006).

Tiersten, H. F., et al., "An Analysis of Thickness-Extensional Trapped Energy Resonant Device Structures with Rectangular Electrodes in the Piezoelectric Thin Film on Silicon Configuration", *J. Appl. Phys.* 54 (10), (Oct. 1983), 5893-5910.

"Search Report from corresponding application", No. GB0605225.2.

"Search Report for Great Britain Patent Application", No. 0617742.2, (Mar. 29, 2007).

"Search Report for Great Britain Patent Application", No. 0617742.2, (Dec. 13, 2006).

"Search Report in the Great Britain Patent Application", No. 0619698.4, (Nov. 30, 2006).

Ruby, R. et al., "The Effect of Perimeter Geometry on FBAR Resonator Electrical Performance", *Microwave Symposium Digest, 2005 IEEE MTT-S International*, (Jun. 12, 2005), 217-221.

Schuessler, Hans H., "Ceramic Filters and Resonators", Reprinted from *IEEE Trans. Sonics Ultrason.*, vol. SU- 21, (Oct. 1974), 257-268.

Fattinger, G. G., et al., "Coupled Bulk Acoustic Wave Resonator Filters: Key technology for single-to-balanced RF filters", 0-7803-8331-1/4/W20.00; *IEEE MTT-S Digest*, (2004), 927-929.

Choi, Sungjin et al., "Design of Half-Bridge Piezo-Transformer Converters in the AC Adapter Applications", *IEEE* 2005, 244-248.

Li, Yunxiu et al., "AC-DC Converter with Worldwide Range Input Voltage by Series and Parallel Piezoelectric Transformer Connection", *35th Annual IEEE Power Electronics Specialists Conference*, (2004).

Ivensky, Gregory et al., "A Comparison of Piezoelectric Transformer AC/DC Converters with Current Doubler and voltage Doubler Rectifiers", *IEEE Transactions on Power Electronics*, vol. 19, No. 6, (Nov. 2004).

Navas, J. et al., "Miniaturized Battery Charger using Piezoelectric Transformers", *IEEE*, (2001), 492-496.

Jiang, Yimin et al., "A Novel Single-Phase Power Factor Correction Scheme", *IEEE*, (1993), 287-292.

Krishnaswamy, S.V. et al., "Film Bulk Acoustic Wave Resonator Technology", (May 29, 1990), 529-536.

Lobl, H.P. et al., "Piezoelectric Materials for BAW Resonators and Filters", 2001 *IEEE Ultrasonics Symposium*, (Jan. 1, 2001), 807-811.

* cited by examiner

CAVITY-LESS FILM BULK ACOUSTIC RESONATOR (FBAR) DEVICES

RELATED APPLICATION

This application is a Continuation-in-Part of the following U.S. patent applications: Ser. No. 10/699,289 filed Oct. 30, 2003 of John D. Larson III entitled Stacked Bulk Acoustic Resonator Band-Pass Filter with Controllable Pass Bandwidth (now U.S. Pat. No. 7,019,605), Ser. No. 10/699,481 filed Oct. 30, 2003 of John D. Larson III and Richard Ruby entitled Thin-Film Acoustically-Coupled Transformer (now U.S. Pat. No. 6,946,928), Ser. No. 10/965,541 filed Oct. 13, 2004 of John D. Larson III, Richard Ruby and Stephen Ellis entitled Decoupled Stacked Bulk Acoustic Resonator Band-Pass Filter with Controllable Pass Bandwidth, and Ser. No. 10/965,637 filed Oct. 13, 2004 of John D. Larson III, Richard Ruby and Stephen Ellis entitled Film Acoustically-Coupled Transformer. The application is also related to U.S. patent application Ser. No. 10/969,636 of John D. Larson III, Stephen Ellis and Yury Oshamyansky entitled Film Bulk Acoustic Resonator Devices with Simplified Packaging filed on the same day as this application. The above applications are all assigned to the assignee of this application and the disclosures of the above applications are incorporated into this application by reference.

BACKGROUND

FBAR devices that incorporate one or more film bulk acoustic resonators (FBARs) form part of an ever-widening variety of electronic products, especially wireless products. For example, modern cellular telephones incorporate a duplexer in which each of the band-pass filters includes a ladder circuit in which each element of the ladder circuit is an FBAR. A duplexer incorporating FBARs is disclosed by Bradley et al. in U.S. Pat. No. 6,262,637 entitled Duplexer Incorporating Thin-film Bulk Acoustic Resonators (FBARs), assigned to the assignee of this disclosure and incorporated into this disclosure by reference. Such duplexer is composed of a transmitter band-pass filter connected in series between the output of the transmitter and the antenna and a receiver band-pass filter connected in series with 90° phase-shifter between the antenna and the input of the receiver. The center frequencies of the pass-bands of the transmitter band-pass filter and the receiver band-pass filter are offset from one another. Ladder filters based on FBARs are also used in other applications.

FIG. 1 shows an exemplary embodiment of an FBAR-based band-pass filter 10 suitable for use as the transmitter band-pass filter of a duplexer. The transmitter band-pass filter is composed of series FBARs 12 and shunt FBARs 14 connected in a ladder circuit. Series FBARs 12 have a higher resonant frequency than shunt FBARs 14.

FIG. 2 shows an exemplary embodiment 30 of an FBAR. FBAR 30 is composed a pair of electrodes 32 and 34 and a piezoelectric element 36 between the electrodes. The piezoelectric element and electrodes are suspended over a cavity 44 defined in a substrate 42. This way of suspending the FBAR allows the FBAR to resonate mechanically in response to an electrical signal applied between the electrodes.

Above-mentioned U.S. patent application Ser. No. 10/699,289, of which this application is a Continuation-in-Part discloses a band-pass filter that incorporates a decoupled stacked bulk acoustic resonator (DSBAR) composed of a lower FBAR, an upper FBAR stacked on lower FBAR and an acoustic decoupler between the FBARs. Each of the FBARs is composed of a pair of electrodes and a piezoelectric element between the electrodes. An electrical input signal is applied between electrodes of the lower FBAR and the upper FBAR provides a band-pass filtered electrical output signal between its electrodes. The electrical input signal may alternatively be applied between the electrodes of the upper FBAR, in which case, the electrical output signal is taken from the electrodes of the lower FBAR.

Above-mentioned U.S. patent application Ser. No. 10/699,481, of which this disclosure is a Continuation-in-Part, discloses a film acoustically-coupled transformer (FACT) composed of two decoupled stacked bulk acoustic resonators (DSBARs). A first electrical circuit interconnects the lower FBARs of the DSBARs in series or in parallel. A second electrical circuit interconnects the upper FBARs of the DSBARs in series or in parallel. Balanced or unbalanced FACT embodiments having impedance transformation ratios of 1:1 or 1:4 can be obtained, depending on the configurations of the electrical circuits. Such FACTs also provide galvanic isolation between the first electrical circuit and the second electrical circuit.

In the above-described DSBARs and FACTs, each lower FBAR is suspended over a cavity in a substrate similar to the cavity 44 described above with reference to FIG. 2. The cavity allows the constituent FBARs to resonate mechanically in response to an electrical signal applied between the electrodes of one or more of the FBARs.

The FBAR described above with reference to FIG. 2 and devices, such as ladder filters, DSBARs and FACTs, incorporating one or more FBARs will be referred to generically in this disclosure as FBAR devices.

Practical embodiments of FBAR devices are made by forming a cavity in a rigid substrate, such as a silicon substrate, filling the cavity with sacrificial material, planarizing the surface of the substrate, and depositing and patterning the respective layers of the FBAR device on the surface of the sacrificial material, as described in above-mentioned above-mentioned U.S. patent application Ser. No. 10/699,298, for example, but parts of the surface of the sacrificial material remain exposed. Portions of at least the layer of piezoelectric material that provides the piezoelectric element 116 additionally overlap the substrate outside the cavity. After all the layers have been deposited and patterned, a release etch is performed to remove the sacrificial material from the cavity. This leaves the FBAR device suspended over the cavity as shown in FIG. 2.

The need to perform a release etch at the end of the fabrication process limits the choice of materials that can be used to form the substrate, electrodes and piezoelectric element(s) of the FBAR device to materials that are etch compatible with the release etch. It is sometimes desirable not to be subject to this constraint. Moreover, even when etch-compatible materials are used, the release etch can cause separation between the layers of the FBAR device with a consequent impairment of the performance. Accordingly, an alternative way of making FBAR devices that does not involve performing a release etch is desired.

U.S. Pat. No. 6,107,721 of Lakin discloses an FBAR device with an acoustic reflector interposed between the FBAR device and the substrate. No release etch is required in the fabrication of this device. The acoustic reflector is based on a Bragg reflector and is composed of alternating layers silicon dioxide and non-piezoelectric aluminum nitride. In the example disclosed by Lakin, the acoustic reflector had nine layers. Lakin further indicates that more or fewer layers can be used.

The need to deposit nine or more additional layers of material to form the acoustic reflector significantly complicates the process of fabricating the FBAR device notwithstanding the lack of a release etch. Moreover, attempts to simplify the process by reducing the number of layers results in an FBAR device whose frequency response exhibits undesirable spurious artifacts. The artifacts result from to the reduced isolation provided by the reduced number of layers allowing the FBAR device to interact mechanically with the substrate.

Some commercially-available FBAR devices incorporate an acoustic reflector composed of alternating layers of silicon dioxide and a metal. However, the frequency responses of such FBAR devices exhibit undesirable spurious artifacts, such as additional transmission peaks in the stop band.

What is needed therefore is a way of isolating an FBAR device from the substrate that does not require a release etch, that does not unduly complicate the fabrication process and that provides sufficient isolation between the FBAR device and the substrate that the frequency response of the FBAR device is free from undesirable spurious artifacts.

SUMMARY OF THE INVENTION

In a first aspect, the invention provides a film bulk acoustic resonator (FBAR) device comprising a substrate, an acoustic Bragg reflector over the substrate, a piezoelectric element over the acoustic Bragg reflector, and a remote-side electrode over the piezoelectric element. The acoustic Bragg reflector comprises a metal Bragg layer and a plastic Bragg layer juxtaposed with the metal Bragg layer.

Examples of an FBAR device include an FBAR, such as an FBAR that provides an element of a ladder filter, a stacked bulk acoustic resonator (SBAR), a decoupled stacked bulk acoustic resonator (DSBAR), a band-pass filter, and a film acoustically-coupled transformer (FACT).

In one embodiment, the metal Bragg layer is patterned to define a substrate-side electrode. In another embodiment, the metal Bragg layer is a first metal Bragg layer, the acoustic Bragg reflector additionally comprises a second metal Bragg layer juxtaposed with the plastic Bragg layer and the FBAR device additionally comprises a substrate-side electrode between the acoustic Bragg reflector and the piezoelectric element.

The large ratio between the acoustic impedances of the metal of the metal Bragg layer and the plastic material of the plastic Bragg layer provides sufficient acoustic isolation between the FBAR and the substrate for the frequency response of the FBAR device to exhibit minor, if any, spurious artifacts arising from undesirable acoustic coupling between the FBAR and the substrate. This is especially true with respect to the embodiment having a third Bragg layer and the substrate-side electrode.

The large ratio between the acoustic impedances of the metal of the metal Bragg layer and the plastic material of the plastic Bragg layer means that the FBAR device can typically be composed of between one and four Bragg layers in addition to the layers constituting the FBAR itself. This means that the fabrication process of the FBAR device in accordance with the invention is minimally, if at all, more complex than the fabrication process of a conventional FBAR device of the same type. In particular, the fabrication process lacks the above-mentioned release etch operation.

In a second aspect, the invention provides a film bulk acoustic resonator (FBAR) device comprising a substrate, an acoustic Bragg reflector over the substrate, a piezoelectric element over the acoustic Bragg reflector, and a remote-side electrode over the piezoelectric element. The acoustic Bragg reflector comprises a first Bragg layer and a second Bragg layer juxtaposed with the first Bragg layer. The first Bragg layer comprises a first material having an acoustic impedance less than five and the second Bragg layer comprises a second material having an acoustic impedance greater than 50. In an embodiment, the first material has an acoustic impedance less than three and the second material has an acoustic impedance greater than 60.

In a final aspect, the invention provides a film bulk acoustic resonator (FBAR) device comprising a substrate, an acoustic Bragg reflector over the substrate, a piezoelectric element over the acoustic Bragg reflector, and a remote-side electrode over the piezoelectric element. The acoustic Bragg reflector comprises a first Bragg layer and a second Bragg layer juxtaposed with the first Bragg layer. The first Bragg layer comprises a first material having a first acoustic impedance. The second Bragg layer comprises a second material having a second acoustic impedance. The second acoustic impedance and the first acoustic impedance have a ratio greater than ten. In an embodiment, the second acoustic impedance and the first acoustic impedance have a ratio greater than 16.

DETAILED DESCRIPTION

Figure 1:
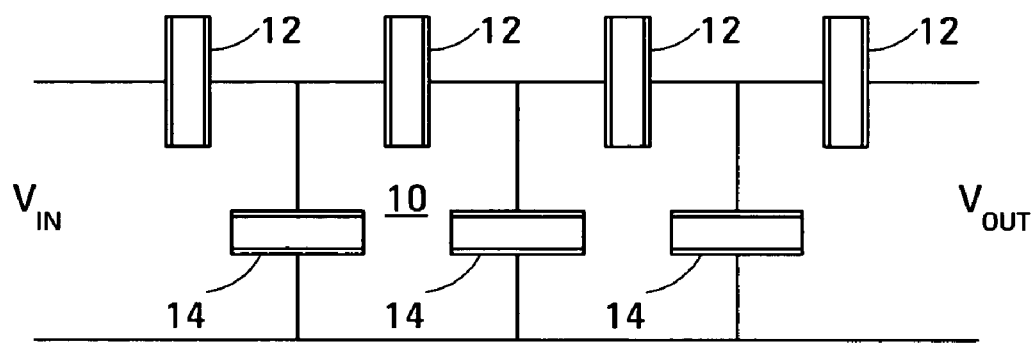
FIG. 1 is a schematic drawing of a ladder filter incorporating FBARs in accordance with the prior art.
Figure 3A:
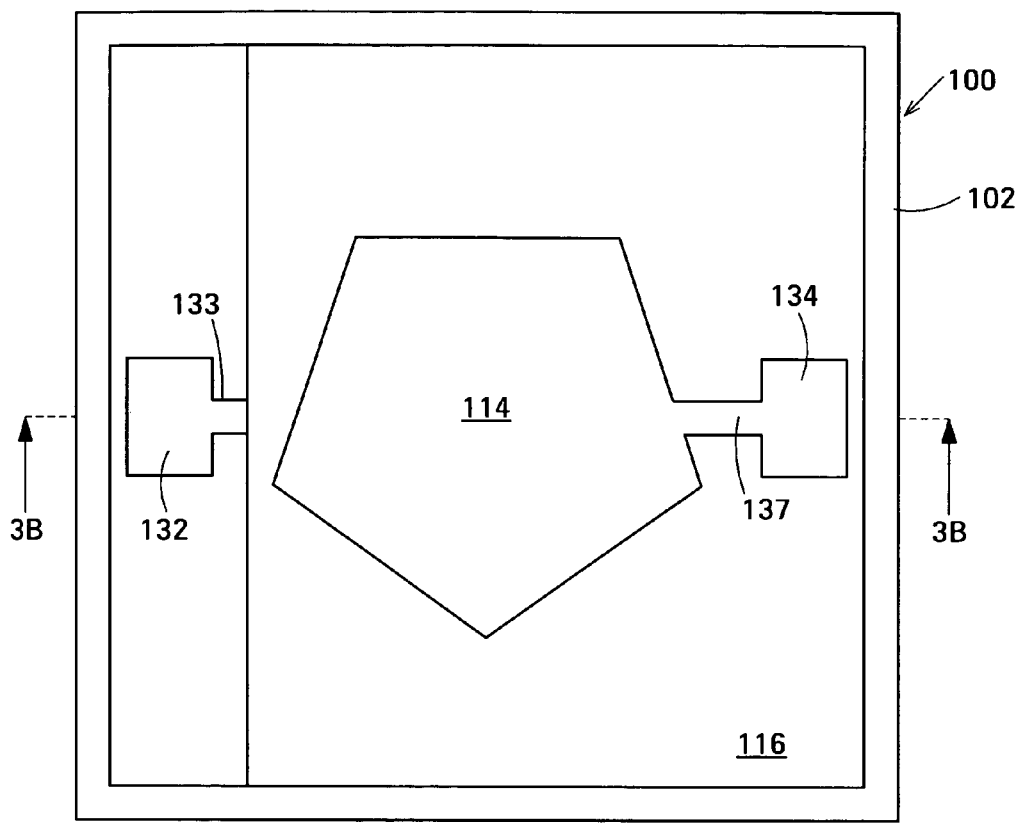
FIG. 3A is a plan view of a first embodiment of an FBAR device in accordance with the invention.
Figure 3B:
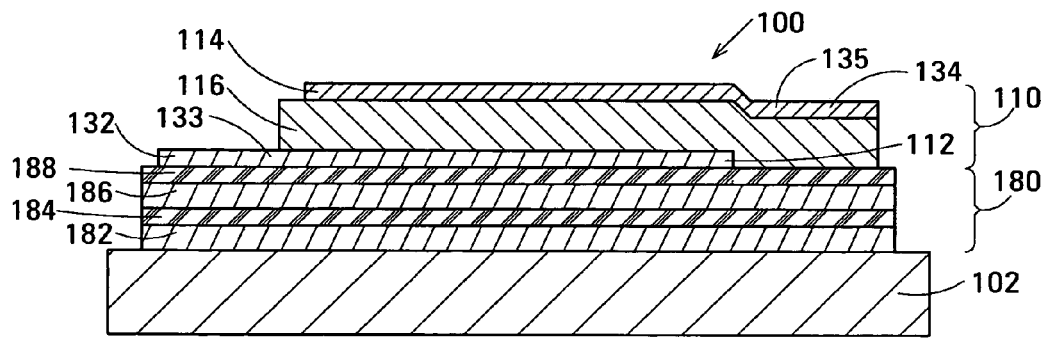
FIG. 3B is a cross-sectional view of the first embodiment of an FBAR device along the section line 3B—3B shown in FIG. 3A.

FIGS. 3A and 3B are respectively a plan view and a cross-sectional view of a first exemplary embodiment 100 of an FBAR device in accordance with the invention. FBAR device 100 comprises a single FBAR 110. Single FBAR 110 is typically an element of an FBAR ladder filter such as that shown in FIG. 1 or a duplexer, but the remaining elements of the ladder filter or duplexer are omitted to simplify the drawing.

Referring to FIG. 3B, FBAR device 100 is composed of a substrate 102, an acoustic Bragg reflector 180 over the substrate, a piezoelectric element 116 over the acoustic Bragg reflector and a remote-side electrode 114 over piezoelectric element 116. Acoustic Bragg reflector 180 comprises a first metal Bragg layer 182 juxtaposed with a first plastic Bragg layer 184. In the example shown, first metal Bragg layer 182 is juxtaposed with the substrate and acoustic Bragg reflector 180 is additionally composed of a second metal Bragg layer 186 juxtaposed with first plastic Bragg layer 184 and a second plastic Bragg layer 188 juxtaposed with second metal Bragg layer 186. Also in the example shown, FBAR device 100 is additionally composed of a substrate-side electrode 112 located between acoustic Bragg reflector 180 and piezoelectric element 116. Substrate-side electrode 112, piezoelectric element 116 and remote-side electrode 114 collectively constitute a film bulk acoustic resonator (FBAR) 110. Acoustic Bragg reflector 180 acoustically isolates FBAR 110 from substrate 102.

Bragg layers described in this disclosure as juxtaposed typically physically contact one another as shown in FIG. 3B. However, juxtaposed Bragg layers may be separated by intervening layers provided such intervening layers have a negligible effect on the acoustical properties of the juxtaposed Bragg layers.

FBAR device 100 has a band-pass frequency response characteristic having a center frequency. As used in this disclosure, the term Bragg layer refers to a layer having a nominal thickness t of an odd integral multiple of one quarter of the wavelength $\lambda_n$ in the material of the Bragg layer of an acoustic signal equal in frequency of the center frequency, i.e., $t=(2m+1)\lambda_n/4$, where m is an integer greater than or equal to zero. Bragg layers in which the integer m is zero typically reduce the likelihood of the frequency response of the FBAR device exhibiting spurious artifacts. In such Bragg layers, the nominal thickness of the Bragg layer is one quarter of the wavelength in the material of the layer of the above-mentioned acoustic signal, i.e., $t=\lambda_n/4$. Moreover, as will be described in more detail below, embodiments in which at least the Bragg layers of metal are as thin as $\lambda_n/16$ will give sufficient acoustic isolation for use in many applications.

The inventors have discovered that the acoustic isolation provided by an acoustic Bragg reflector depends on the ratio of the acoustic impedances of the materials of the Bragg layers constituting the acoustic Bragg reflector. The effective acoustic impedance $Z_{eff1}$ presented by a first Bragg layer having a thickness of $\lambda_n/4$ juxtaposed with another layer is the acoustic impedance seen at the surface of the first Bragg layer remote from the other layer. The acoustic impedance presented by the first Bragg layer depends on the acoustic impedance of the first Bragg layer and the effective acoustic impedance presented to the first Bragg layer by the other layer. The effective acoustic impedance presented by the first Bragg layer is given by:

$$Z_{eff1}=Z_p^2/Z_m \quad (1)$$

where $Z_p$ is the acoustic impedance of the material of the first Bragg layer and $Z_m$ is the acoustic impedance of the other layer.

For example, the effective acoustic impedance at the surface of first metal Bragg layer 182 remote from substrate 102 depends on the acoustic impedance of the material of first metal Bragg layer 182 and the acoustic impedance of the material of substrate 102. In this example, $Z_{eff1}$ is the effective acoustic impedance presented at the surface of first metal Bragg layer 182 remote from substrate 102, $Z_p$ is the acoustic impedance of the material of first metal Bragg layer 182 and $Z_m$ is the acoustic impedance of the material of substrate 102.

The relationship defined by equation (1) exists between each Bragg layer and the preceding Bragg layer. In equation (1), $Z_m$ is the effective acoustic impedance presented to the Bragg layer by the preceding Bragg layer.

For example, first metal Bragg layer 182 presents effective acoustic impedance $Z_{eff1}$ to first plastic Bragg layer 184. First plastic Bragg layer 184 transforms the effective acoustic impedance $Z_{eff1}$ to another effective acoustic impedance $Z_{eff2}$, and presents effective acoustic impedance $Z_{eff2}$ to second metal Bragg layer 186. Second metal Bragg layer 186 transforms the effective acoustic impedance $Z_{eff2}$ to another effective acoustic impedance $Z_{eff3}$, and presents effective acoustic impedance $Z_{eff3}$ to second plastic Bragg layer 188. Second plastic Bragg layer 188 transforms the effective acoustic impedance $Z_{eff3}$ to another effective acoustic impedance $Z_{eff4}$, and presents effective acoustic impedance $Z_{eff4}$ to FBAR 110. Effective acoustic impedance $Z_{eff4}$ is also the effective acoustic impedance of acoustic Bragg reflector 180.

The acoustic impedance mis-match between FBAR 110 and the effective acoustic impedance presented by acoustic Bragg reflector 180 at second plastic Bragg layer 188 provides the acoustic isolation between FBAR 110 and substrate 102. The effective acoustic impedances presented by Bragg layers 182, 184, 186 and 188, respectively, alternate between high and low, the high impedance increasing and the low impedance decreasing, from first metal Bragg layer 182 to second plastic Bragg layer 188.

For acoustic Bragg reflector 180 to provide effective acoustic isolation, the effective acoustic impedance it presents to FBAR 110 may be greater than or less than the acoustic impedance of the FBAR. The acoustic isolation provided by acoustic Bragg reflector 180 may be quantified by the absolute value of the ratio of the effective acoustic impedance of acoustic Bragg reflector 180 and the acoustic impedance of FBAR 110 expressed in decibels (20 times the logarithm of the ratio). Increasing the acoustic isolation reduces the likelihood that the frequency response of the FBAR will exhibit undesirable spurious artifacts due to unwanted coupling between the FBAR and the substrate.

In accordance with the invention, acoustic Bragg reflector 180 is composed of metal Bragg layers 182 and 186 alternating with plastic Bragg layers 184 and 188 of a plastic material. In an embodiment, the metal is a refractory metal such as tungsten or molybdenum, respectively. The acoustic impedance of the metal of the metal Bragg layers is high while that of the plastic material of the plastic Bragg layers is low. The large ratio between the acoustic impedances of metals and plastic materials enables acoustic Bragg reflector 180 to provide an acoustic isolation of many tens of decibels using relatively few Bragg layers. Several refractory metals are available that have an acoustic impedance of greater than 50 Mrayl and that are compatible with the etchants used in typical FBAR fabrication processes. Molybdenum, for example, has an acoustic impedance of about 63 Mrayl. Several plastic materials are available that have an acoustic impedance of less than 5 Mrayl and that are compatible with the high temperatures and etchants used in typical FBAR fabrication processes. The acoustic impedances of some such plastic materials are as low as about 2 Mrayl. Thus, several combinations of metals and plastics having an acoustic impedance ratio greater than ten are available. One combination of molybdenum and a crosslinked polyphenylene polymer that will be described below has an acoustic impedance ratio of about 30.

Plastic materials compatible with the high temperatures (>400° C.) and etchants to which first plastic Bragg layer 184 and second plastic Bragg layer 188 are subject during subsequent fabrication of FBAR 110 are available with acoustic impedances in the range from about 2 Mrayl to about 4 Mrayl. Due to the square term in equation (1), first plastic Bragg layer 184 of plastic material having an acoustic impedance of about 4 Mrayl and first metal Bragg layer 182 of refractory metal collectively provide an effective acoustic impedance about 1/14 that of a structure composed of a metal Bragg layer and a Bragg layer of $SiO_2$. With a plastic material having an acoustic impedance of 2 Mrayl, the effective acoustic impedance is about 1/56 that of the above-described similar metal/$SiO_2$ structure.

Using metal, such as a refractory metal, with an acoustic impedance greater than about 50 Mrayl as the material of first metal Bragg layer 182 and second metal Bragg layer 186, and plastic material having an acoustic impedance of less than about 5 Mrayl as the material of first plastic Bragg layer 184 and second plastic Bragg layer 188 result in acoustic Bragg reflector 180 having an effective acoustic impedance of about 0.1 krayl to FBAR 110. Assuming that FBAR 110 has an effective acoustic impedance of about 50 Mrayl, an embodiment of acoustic Bragg reflector 180 composed of such materials would provide an acoustic isolation of over 100 dB. For comparison, the air in cavity 44 in of FBAR device 30 shown in FIG. 2 has an acoustic impedance of about 1 krayl and provides a calculated acoustic isolation less than about 90 dB. Thus, Acoustic Bragg reflector 180 provides sufficient acoustic isolation between FBAR 110 and substrate 102 for the frequency response of FBAR 110 to have a frequency response substantially free of spurious artifacts. Embodiments in which the plastic material has an acoustic impedance of about 2 Mrayl provide a calculated acoustic isolation of over 120 dB.

Embodiments requiring even greater acoustic isolation between FBAR 110 and substrate 102 can have additional pairs of Bragg layers of plastic and metal interposed between first Bragg layer 182 and substrate 102. However, the acoustic isolation provided by acoustic Bragg reflector 180 is sufficient for most applications.

Substrate-side electrode 112, remote-side electrode 114 and piezoelectric layer 116 form a mechanical structure having a mechanical resonance that defines the center frequency of the pass-band of FBAR 110. Substrate-side electrode 112, remote-side electrode 114 and piezoelectric element 116 are similar in thickness to the corresponding elements of a conventional FBAR whose band-pass frequency response has the same nominal center frequency. As a result, FBAR device 100 has electrical characteristics similar to those of a similar conventional FBAR device.

FBAR device 100 additionally has a terminal pad 132, a terminal pad 134, an electrical trace 133 that electrically connects terminal pad 132 to substrate-side electrode 112, and an electrical trace 135 that electrically connects terminal pad 134 to remote-side electrode 114. Terminal pads 132 and 134 are used to make electrical connections from FBAR device 100 to external electrical circuits (not shown).

Figure 2:
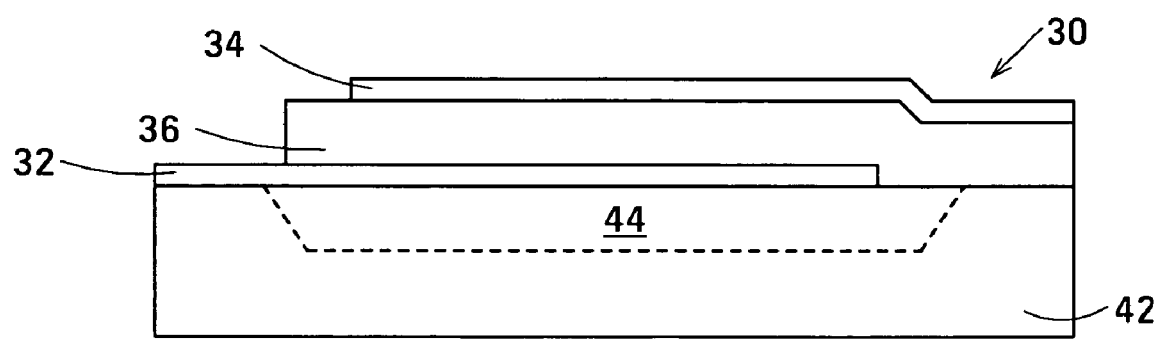
FIG. 2 is a cross-sectional view of an FBAR in accordance with the prior art.

Fabrication of FBAR device 100 is comparable in complexity to that of the conventional air-isolated FBAR device 30 shown in FIG. 2: operations to form and fill cavity 44 and perform the release etch are eliminated, and operations to deposit four Bragg layers of metal, plastic, metal and plastic, respectively are added. Fabrication of FBAR device 100 is substantially less complex than a conventional FBAR device having a conventional acoustic Bragg reflector that uses many more layers of materials having smaller differences in their acoustic impedances to provide the needed acoustic isolation. For example, an acoustic Bragg reflector that has $SiO_2$ as its lower acoustic impedance material needs eight Bragg layers to provide 100 dB of acoustic isolation. Moreover, the thickness of an $SiO_2$ Bragg layer is about three times that of a plastic Bragg layer. This further reduces the overall thickness of the acoustic Bragg reflector, and ameliorates step-coverage problems.

In embodiments of the FBAR devices described in this disclosure, polyimide is used as the material of the plastic Bragg layers. Polyimide is sold under the trademark Kapton® by E. I. du Pont de Nemours and Company. In such embodiments, plastic Bragg layers 184 and 188 are each composed of polyimide applied by spin coating. Polyimide has an acoustic impedance of about 4 Mrayl.

In other embodiments, a poly(para-xylylene) is used as the material of the plastic Bragg layers. In such embodiments, plastic Bragg layers 184 and 188 are each composed of poly(para-xylylene) applied by vacuum deposition. Poly (para-xylylene) is also known in the art as parylene. The dimer precursor di-para-xylylene from which parylene is made and equipment for performing vacuum deposition of layers of parylene are available from many suppliers. Parylene has an acoustic impedance of about 2.8 Mrayl.

In further embodiments, a crosslinked polyphenylene polymer is used as the material of the plastic Bragg layers. In such embodiments, plastic Bragg layers 184 and 188 are each composed of the crosslinked polyphenylene polymer applied by spin coating. Crosslinked polyphenylene polymers have been developed as low dielectric constant dielectric materials for use in integrated circuits and consequently remain stable at the high temperatures to which the crosslinked polyphenylene polymer is subject during the subsequent fabrication of FBAR 110. The inventors have discovered that crosslinked polyphenylene polymers additionally have a calculated acoustic impedance of about 2 Mrayl. This acoustic impedance provides an especially high acoustic isolation.

Precursor solutions containing various oligomers that polymerize to form respective crosslinked polyphenylene polymers are sold by The Dow Chemical Company, Midland, Mich., under the trademark SiLK. The precursor solutions are applied by spin coating. The crosslinked polyphenylene polymer obtained from one of these precursor solutions designated SiLK™ J, which additionally contains an adhesion promoter, has a calculated acoustic impedance of 2.1 Mrayl, i.e., about 2 Mrayl.

The oligomers that polymerize to form crosslinked polyphenylene polymers are prepared from biscyclopentadienone- and aromatic acetylene-containing monomers. Using such monomers forms soluble oligomers without the need for undue substitution. The precursor solution contains a specific oligomer dissolved in gamma-butyrolactone and cyclohexanone solvents. The percentage of the oligomer in the precursor solution determines the layer thickness when the precursor solution is spun on. After application, applying heat evaporates the solvents and then cures the oligomer to form a cross-linked polymer. The biscyclopentadienones react with the acetylenes in a 4+2 cycloaddition reaction that forms a new aromatic ring. Further curing results in the cross-linked polyphenylene polymer. The above-described crosslinked polyphenylene polymers are disclosed by Godschalx et al. in U.S. Pat. No. 5,965,679, incorporated herein by reference. Additional practical details are described by Martin et al., *Development of Low-Dielectric Constant Polymer for the Fabrication of Integrated Circuit Interconnect*, 12 ADVANCED MATERIALS, 1769 (2000), also incorporated by reference. Compared with polyimide, crosslinked polyphenylene polymers have a lower acoustic impedance, a lower acoustic attenuation and a lower dielectric constant. Moreover, a spun-on layer of the precursor solution is capable of producing a high-quality film of the crosslinked polyphenylene polymer with a thickness of the order of 200 nm, which is a typical thickness of plastic Bragg layers 184 and 188.

Each of the Bragg layers 182, 184, 186 and 188 has a nominal thickness of one quarter of the wavelength in the material of the Bragg layer of an acoustic signal equal in frequency to the center frequency of the pass band of FBAR 110. With quarter-wave thick Bragg layers, acoustic Bragg reflector 180 presents a calculated effective acoustic impedance of about 310 rayl with polyimide plastic Bragg layers and about 19 rayl with crosslinked polyphenylene polymer plastic Bragg layers. These acoustic impedances correspond to acoustic isolations of about 104 dB and 128 dB, respectively.

In an embodiment of acoustic Bragg reflector 180 structured to operate at about 2 GHz in which the plastic material of the plastic Bragg layers 184 and 188 is crosslinked polyphenylene polymer and the metal of the metal Bragg layers 182 and 186 is molybdenum, the thickness of the plastic Bragg layers is about 190 nm and the thickness of the metal Bragg layers is about 800 nm. Precursor solutions for crosslinked polyphenylene polymers formulated to spin on with a thickness of about 190 nm are commercially available. Polyimide can also be spun on in layers of this thickness. Accordingly, forming plastic Bragg layers 184 and 188 as nominal quarter-wave layers is straightforward. On the other hand, sputter depositing molybdenum to a thickness of 800 nm with high material quality and patterning such a layer is difficult to do using current production technology. However, the large acoustic impedance transformation ratio obtained by juxtaposing a plastic Bragg layer with a refractory metal Bragg layer means that an adequately-large acoustic isolation can be obtained with metal Bragg layers that are substantially thinner than the nominal quarter-wave thickness. Test structures using metal Bragg layers as thin as 220 nm (just thicker than sixteenth wave) produce acceptable results. Using metal Bragg layers about 300 nm, equal in thickness to electrodes 112 and 114 of FBAR 110 in an embodiment structured to operate at about 2 GHz, produces good results.

Using metal Bragg layers that are thinner than quarter-wave layers produces a greater proportional reduction in the acoustic isolation as the number of Bragg layers is reduced. Using current manufacturing technology, better results and lower costs are typically obtained using more Bragg layers in which the metal Bragg layers are thinner than quarter-wave layers than using fewer Bragg layers in which the metal Bragg layers are quarter-wave layers.

The sides of acoustic Bragg reflector 180 are inset laterally from sides of substrate 102 to reduce unwanted acoustic modes.

FIGS. 3C–3F are cross-sectional views of simplified examples of FBAR device 100 in accordance with the invention in which the acoustic Bragg reflector is composed of fewer Bragg layers than acoustic Bragg reflector 180 shown in FIG. 3B. The FBAR devices shown in FIGS. 3C–3F are similar in plan view to FBAR device 100 shown in FIG. 3A.

Figure 3C:
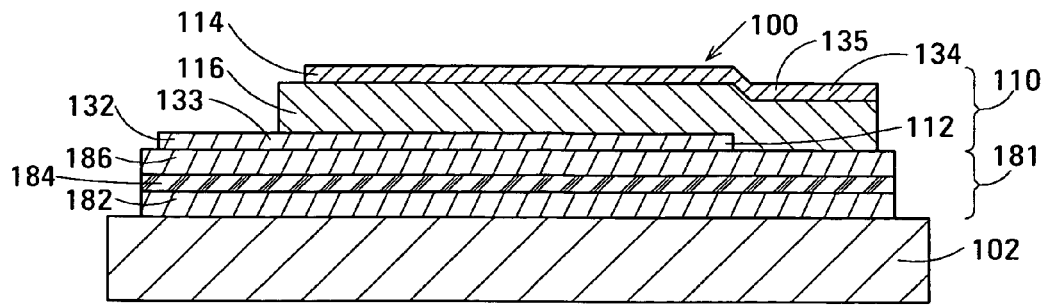
FIGS. 3C–3F are cross-sectional views of alternative structures of the acoustic Bragg reflector of the FBAR device shown in FIG. 3A.

In the FBAR device shown in FIG. 3C, second plastic Bragg layer 188 (FIG. 3B) is omitted and acoustic Bragg reflector 181 is composed of first metal Bragg layer 182 juxtaposed with first plastic Bragg layer 184 and second metal Bragg layer 186 juxtaposed with first plastic Bragg layer 184. FBAR 110 is located on the surface of second metal Bragg layer 186. Substrate-side electrode 112 may be electrically isolated from second metal Bragg layer 186 by an insulating layer substantially thinner than a quarter-wave layer. With quarter-wave thick Bragg layers, acoustic Bragg reflector 181 presents a calculated effective acoustic impedance of about 51 Grayl with polyimide plastic Bragg layers and about 207 Grayl with crosslinked polyphenylene polymer plastic Bragg layers. These acoustic impedances correspond to acoustic isolations of about 60 dB and 72 dB, respectively. The electrical properties of a test structure similar to the embodiment of the FBAR device shown in FIG. 3C will be described below with reference to FIG. 8B.

Figure 3D:
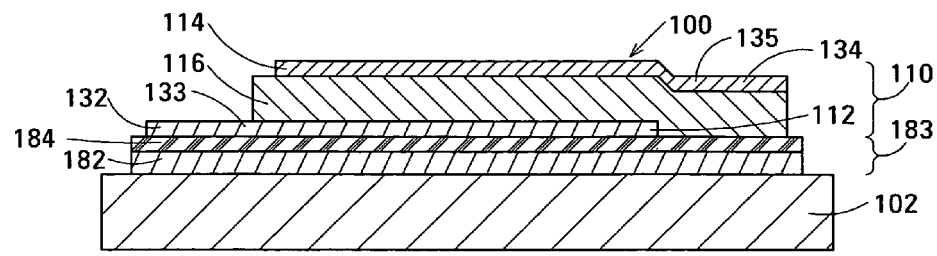

In the FBAR device shown in FIG. 3D, second plastic Bragg layer 188 and second metal Bragg layer 186 (FIG. 3B) are omitted and acoustic Bragg reflector 183 is composed of first metal Bragg layer 182 juxtaposed with first plastic Bragg layer 184. FBAR 110 is located on the surface of first plastic Bragg layer 184. With quarter-wave thick Bragg layers, acoustic Bragg reflector 183 presents a calculated effective acoustic impedance of about 77 krayl with polyimide plastic Bragg layers and about 19 krayl with crosslinked polyphenylene polymer plastic Bragg layers. These acoustic impedances correspond to acoustic isolations of about 56 dB and 68 dB, respectively. The electrical properties of a test structure similar to the embodiment of the FBAR device shown in FIG. 3D will be described below with reference to FIG. 8A.

Figure 3E:
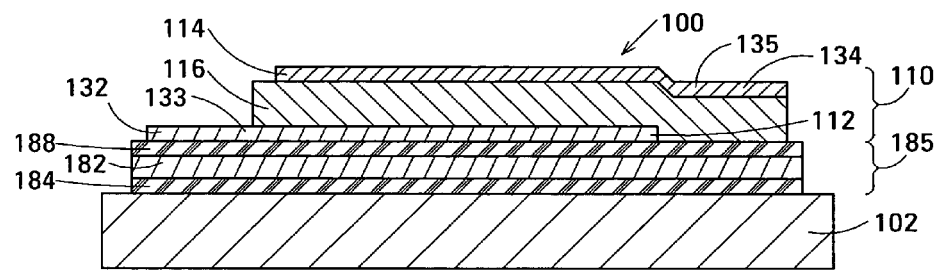
Figure 3F:
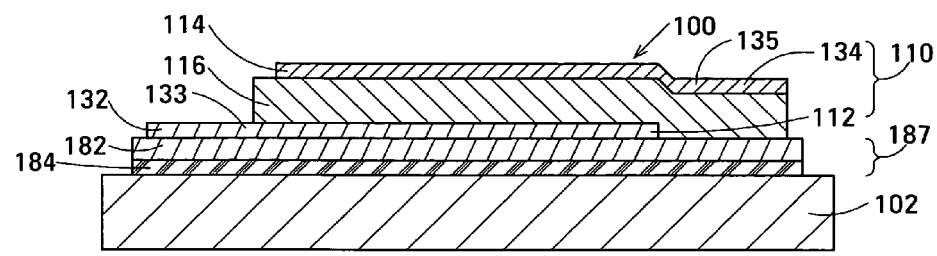

The acoustic impedance of silicon, the material of substrate 102 is about 19 Mrayl, which is intermediate between the acoustic impedances of metal and plastic. Accordingly, embodiments of acoustic Bragg reflector 180 in which first plastic Bragg layer 184 is juxtaposed with substrate 102 will also provide good acoustic isolation. Examples of such embodiments are shown in FIGS. 3E and 3F in which the order of first metal Bragg layer 182 and first plastic Bragg layer 184 is reversed, i.e., first plastic Bragg layer 184 is juxtaposed with substrate 102, and first metal Bragg layer 182 is juxtaposed with first plastic Bragg layer 184. In embodiments of FBAR device 100 in which substrate 102 is a low acoustic impedance material, such as a plastic material, the embodiments shown in FIGS. 3B–3D in which first metal Bragg layer 182 is juxtaposed with substrate 102 provide more acoustic isolation than the embodiments shown in FIGS. 3E and 3F. In embodiments of FBAR device 100 in which substrate 102 is a high acoustic impedance material, the embodiments shown in FIGS. 3E and 3F in which first plastic Bragg layer 184 is juxtaposed with substrate 102 provide more acoustic isolation than the embodiments shown in FIGS. 3B–3D.

In the embodiment of FBAR device 100 shown in FIG. 3E, second metal Bragg layer 186 (FIG. 3B) is omitted and acoustic Bragg reflector 185 is composed of first metal Bragg layer 182 juxtaposed with first plastic Bragg layer 184 and second plastic Bragg layer 188 juxtaposed with first metal Bragg layer 182. FBAR 110 is located on the surface of second plastic Bragg layer 188. With quarter-wave thick Bragg layers, acoustic Bragg reflector 185 presents a calculated effective acoustic impedance of about 3.4 krayl with polyimide plastic Bragg layers and about 0.2 krayl with crosslinked polyphenylene polymer plastic Bragg layers. These acoustic impedances correspond to acoustic isolations of about 83 dB and 107 dB, respectively.

In the embodiment of FBAR device 100 shown in FIG. 3F, second plastic Bragg layer 188 and second metal Bragg layer 186 (FIG. 3B) are omitted and acoustic Bragg reflector 187 is composed of first metal Bragg layer 182 juxtaposed with first plastic Bragg layer 184. FBAR 110 is located on the surface of first metal Bragg layer 182. Substrate-side electrode 112 may be electrically isolated from first metal Bragg layer 182 by an insulating layer substantially thinner than a quarter-wave layer. With quarter-wave thick Bragg layers, acoustic Bragg reflector 187 presents a calculated effective acoustic impedance of about 4.7 Grayl with polyimide plastic Bragg layers and about 18 Grayl with crosslinked polyphenylene polymer plastic Bragg layers. These acoustic impedances correspond to acoustic isolations of about 40 dB and 51 dB, respectively.

Figure 4:
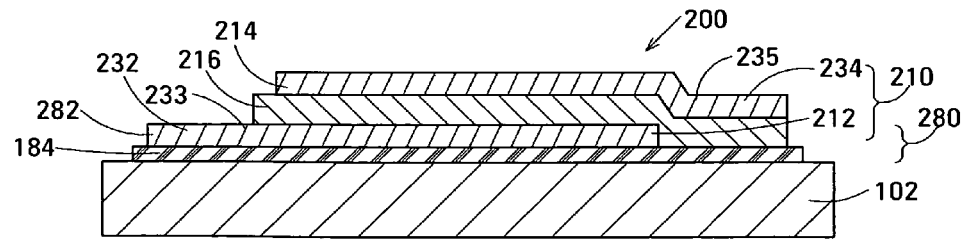
FIG. 4 is a cross-sectional view of a second embodiment of an FBAR device in accordance with the invention.

FIG. 4 is a cross-sectional view of a second exemplary embodiment 200 of an FBAR device in accordance with the invention. FBAR device 200 is similar in plan view to FBAR device 100 shown in FIG. 3A. FBAR device 200 comprises a single FBAR 210. Single FBAR 210 is typically an element of an FBAR ladder filter, such as that shown in FIG. 1, or a duplexer, but the remaining elements of the ladder filter or duplexer are omitted to simplify the drawing.

FBAR device 200 is simpler in structure than FBAR device 100 described above with reference to FIGS. 3A and 3B, but provides less acoustic isolation between the FBAR and the substrate As a result, the frequency response of FBAR device 200 typically exhibits more spurious artifacts than that of FBAR device 100. However, the level of spurious artifacts may be acceptable in many applications.

FBAR device 200 is composed of substrate 102, acoustic Bragg reflector 280 over the substrate, a piezoelectric element 216 over acoustic Bragg reflector 280, and a remote-side electrode 214 over piezoelectric element 216. Acoustic Bragg reflector 280 is composed of metal Bragg layer 282 juxtaposed with plastic Bragg layer 184. Plastic Bragg layer 184 is juxtaposed with substrate 102, and metal Bragg layer 282 is patterned to define the substrate-side electrode 212 of FBAR 210. Bragg layers 282 and 184 each have a nominal thickness of one quarter of the wavelength of the material of the layer of an acoustic wave equal in frequency to the center frequency of FBAR device 200. Remote-side electrode 214 is equal in nominal thickness to substrate-side electrode 212.

Substrate-side electrode 212 defined in metal Bragg layer 282, piezoelectric element 216, and remote-side electrode 214 collectively constitute FBAR 210. Acoustic Bragg reflector 280 acoustically isolates FBAR 210 from substrate 102.

FBAR device 200 additionally has a terminal pad 232, a terminal pad 234, an electrical trace 233 that electrically connects terminal pad 232 to substrate-side electrode 212, and an electrical trace 235 that electrically connects terminal pad 234 to remote-side electrode 214. Terminal pads 232 and 234 are used to make electrical connections from FBAR device 200 to external electrical circuits (not shown).

The acoustic isolation provided by acoustic Bragg reflector 280 composed of plastic Bragg layer 184 and metal Bragg layer 282 is typically not sufficient to eliminate all spurious artifacts from the frequency response of FBAR 210, even when plastic Bragg layer 184 is composed of a plastic material having an acoustic impedance as low as about 2 Mrayl. Nevertheless, as noted above, FBAR device 200 may be used in applications in which some spurious artifacts are acceptable.

FBAR device 200 has the advantage of being maximally simple to fabricate, requiring the deposition of only a single plastic Bragg layer 184 in addition to the layers of metal and piezoelectric material that constitute FBAR 210. Additionally, fabricating FBAR device 200 does not involve performing the above-mentioned release etch.

The electronic properties of FBAR 210 differ somewhat from those of an otherwise-similar, conventional FBAR. Both substrate-side electrode 212 and remote-side electrode 214 are quarter-wave thick layers of metal and are therefore more than twice as thick as the electrodes of the conventional FBAR. Substrate-side electrode 212, remote-side electrode 214 and piezoelectric layer 216 form a mechanical structure having a mechanical resonance that defines the center frequency of the pass-band of FBAR 210. To obtain the same center frequency as the conventional FBAR with the thicker electrodes 212 and 214, piezoelectric element 216 is made thicker than that of the conventional FBAR so that the phase change across the piezoelectric element is $\pi$ radians. This results in a total phase change across FBAR 210 of $3\pi$ radians, compared with a total phase change of $\pi$ radians across the conventional FBAR. Consequently, FBAR 210 has electro-acoustic and electrical properties substantially different from those of the conventional FBAR. For example, FBAR 210 will have a higher Q (narrower bandwidth) and a lower effective coupling constant than FBAR 110. Such characteristics are useable in a number of applications.

Figure 5A:
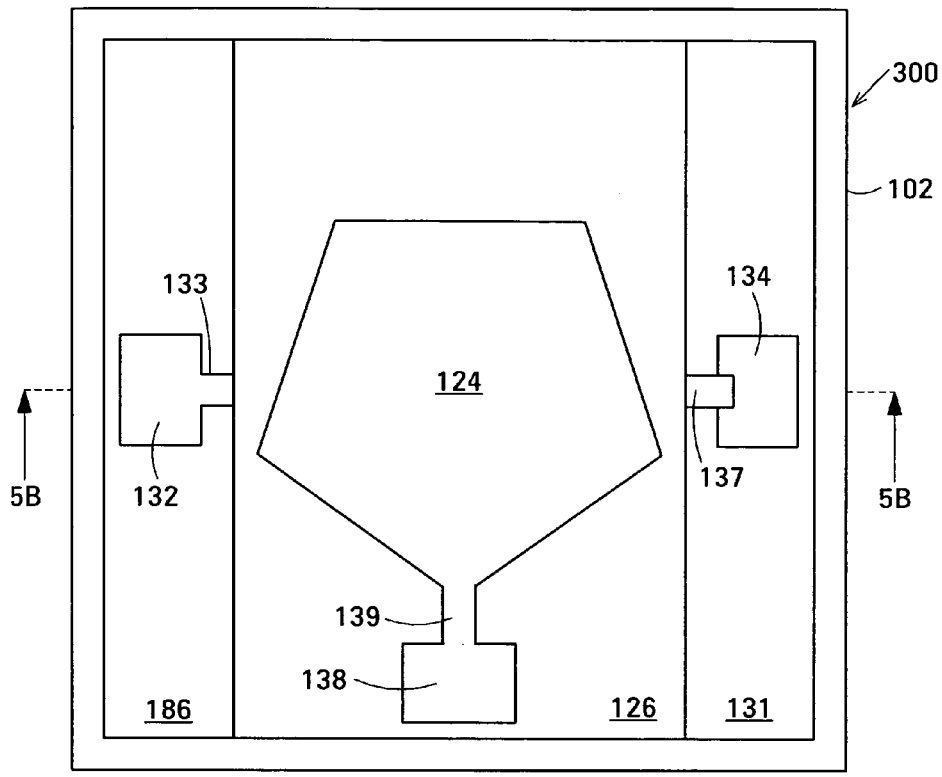
FIG. 5A is a plan view of a third embodiment of an FBAR device in accordance with the invention.
Figure 5B:
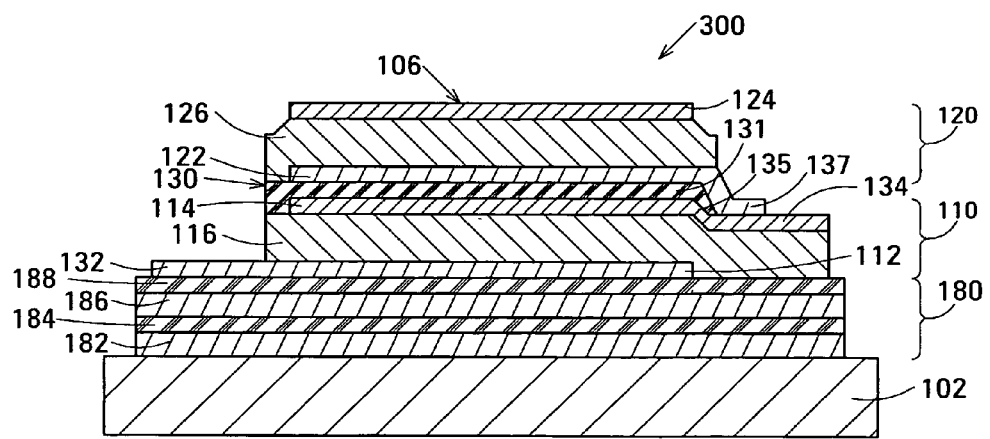
FIG. 5B is a cross-sectional view of the third embodiment of an FBAR device along the section line 5B—5B shown in FIG. 5A.

FIGS. 5A and 5B are respectively a plan view and a cross-sectional view of a third exemplary embodiment 300 of an FBAR device in accordance with the invention. FBAR device 300 is a band-pass filter incorporating a single decoupled stacked bulk acoustic resonator (DSBAR). The example of FBAR device 300 described below has an acoustic Bragg reflector similar in structure to acoustic Bragg reflector 180 described above with reference to FIG. 3B. The acoustic Bragg reflector may alternatively be structured as described above with reference to FIGS. 3C–3F. FBAR device 300 may alternatively incorporate an acoustic Bragg reflector similar to that described above with reference to FIG. 4.

In FBAR device 300, DSBAR 106 is composed of lower FBAR 110, an upper FBAR 120 stacked on lower FBAR 120 and an acoustic decoupler 130 between the FBARs. FBAR 110 is composed of opposed planar electrodes 112 and 114 and piezoelectric element 116 between the electrodes. FBAR 120 is composed of opposed planar electrodes 122 and 124 and a piezoelectric element 126 between the electrodes.

Acoustic decoupier 130 is located between FBARs 110 and 120, specifically, between electrode 114 of FEAR 110 and electrode 122 of FEAR 120. The acoustic decoupler controls the coupling of acoustic energy between FEARs 110 and 120. The acoustic decoupler couples less acoustic energy between the FEARs than would be coupled by direct contact between the FEARs. In the example shown in FIG. 5B, acoustic decoupler 130 is composed of an acoustic decoupling layer 131 of acoustic decoupling material as described in abovementioned U.S. patent application Ser. No. 10/699,289. Alternatively, acoustic decoupler 130 may be composed of layers (not shown) of acoustic decoupling materials having different acoustic impedances, as described in U.S. patent application Ser. No. 10/965,449 of John D. Larson III et al., entitled Pass Bandwidth Control in Decoupled Stacked Bulk Acoustic Resonator Devices, assigned to the assignee of this disclosure and incorporated by reference.

In the example shown, acoustic Bragg reflector 180 is located between DSBAR 106 and substrate 102 and acoustically isolates the DSBAR from the substrate. The structure of acoustic Bragg reflector 180 is described above with reference to FIG. 3B. The large acoustic impedance ratio between the metal of metal Bragg layers 182 and 186 and the plastic material of plastic Bragg layers 184 and 188 enables acoustic Bragg reflector 180 to present a very high effective acoustic impedance to DSBAR 106. The large acoustic impedance ratio between acoustic Bragg reflector 185 and DSBAR 106 enables acoustic Bragg reflector 180 to provide sufficient acoustic isolation between DSBAR 106 and substrate 102 to allow FBARs 110 and 120 to resonate mechanically in response to an input electrical signal applied between the electrodes of one of them. The acoustic energy generated in the FBAR that receives the input electrical signal passes through acoustic decoupler 130 into the other FBAR. The FBAR receiving the acoustic energy converts part of the acoustic energy into an electrical output signal provided between its electrodes. The electrical signal output between the electrodes of the FBAR receiving the acoustic energy has a band-pass frequency response characteristic substantially free of undesirable spurious artifacts.

In the example shown, the electrodes 112 and 114 of FBAR 110 are electrically connected to terminal pads 132 and 134, respectively, by electrical traces 133 and 135, respectively. Additionally, the electrodes 122 and 124 of FBAR 120 are electrically connected to terminal pads 134 and 138, respectively, by electrical traces 137 and 139. In an embodiment that provides electrical isolation between input and output, electrical trace 137 is connected to an additional terminal pad (not shown) instead of to terminal pad 134. Terminal pads 132, 134 and 138 are used to make electrical connections from FBAR device 300 to external electrical circuits (not shown).

In the example shown, a first acoustic decoupling layer 131 provides acoustic decoupler 130. Acoustic decoupling layer 131 is also a quarter-wave layer of plastic material. The same plastic material may be used in acoustic decoupling layer 131 and plastic Bragg layers 184 and 188. The acoustic impedance of the material of acoustic decoupling layer 131 determines the pass bandwidth of FBAR device 300. The need to provide a specified pass bandwidth may result in the acoustic decoupling layer 131 being composed of a different plastic material from plastic Bragg layers 184 and 188.

An alternative embodiment (not shown) has an acoustic Bragg reflector similar in structure to acoustic Bragg reflector 280 described above with reference to FIG. 4 instead of acoustic Bragg reflector 180. In such embodiment, second metal Bragg layer 186 and second plastic Bragg layer 188 is omitted, the order of first metal Bragg layer 182 and first plastic Bragg layer 184 is reversed, first metal Bragg layer 182 is patterned to define substrate-side electrode 112, remote-side electrode 114 is defined in a quarter-wave thick layer of metal and the thickness of piezoelectric element 116 is defined to provide an overall phase change of $3\pi$ radians across FBAR 110. FBAR 120 is structured to have the same resonant frequency as FBAR 110.

Figure 6A:
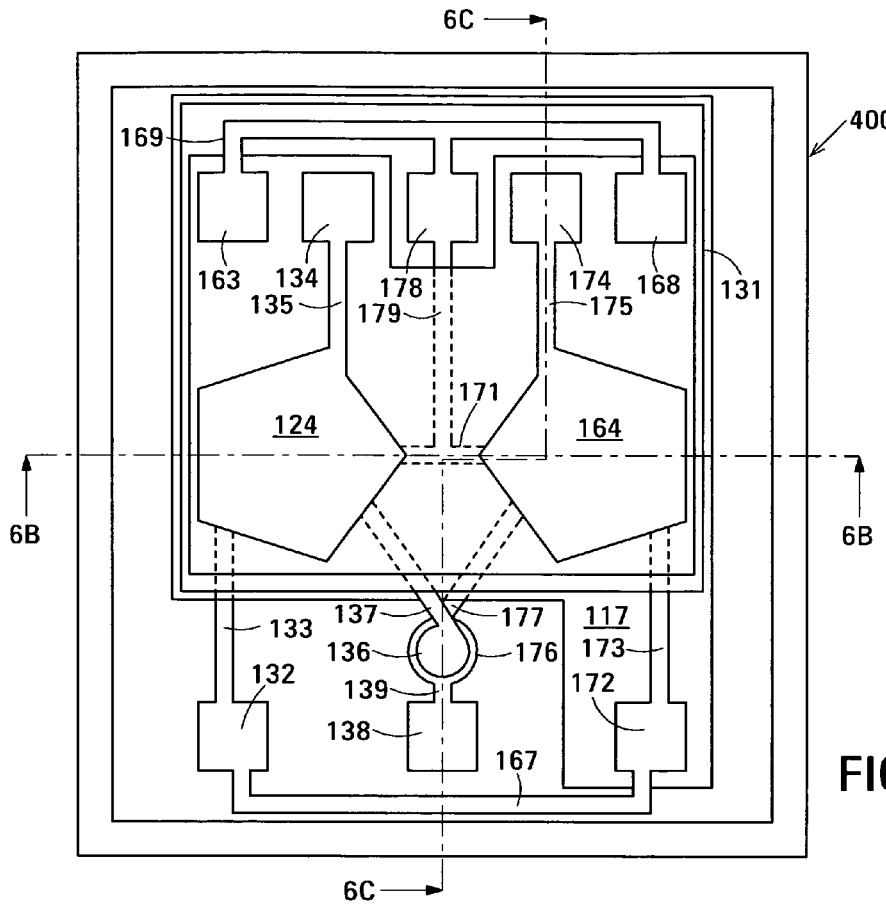
FIG. 6A is a plan view of a fourth embodiment of an FBAR device in accordance with the invention.
Figure 6B:
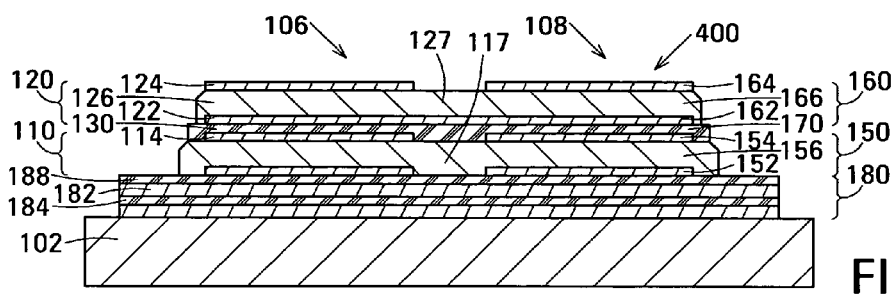
FIG. 6B is a cross-sectional view of the fourth embodiment of an FBAR device along the section line 6B—6B shown in FIG. 6A.
Figure 6C:
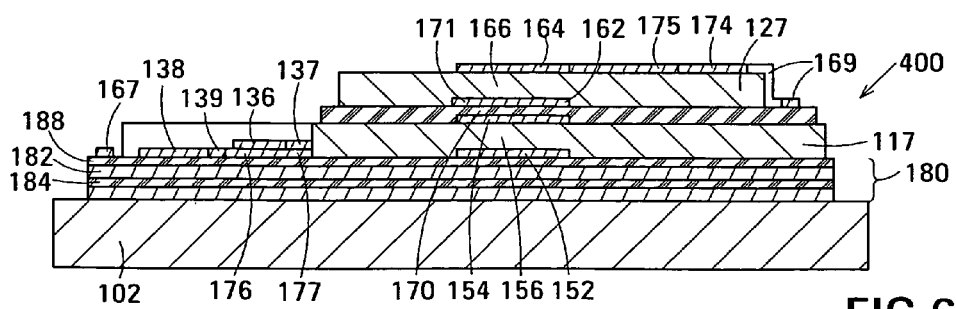
FIG. 6C is a cross-sectional view of the fourth embodiment of an FBAR device along the section line 6C—6C shown in FIG. 6A.
Figure 6D:
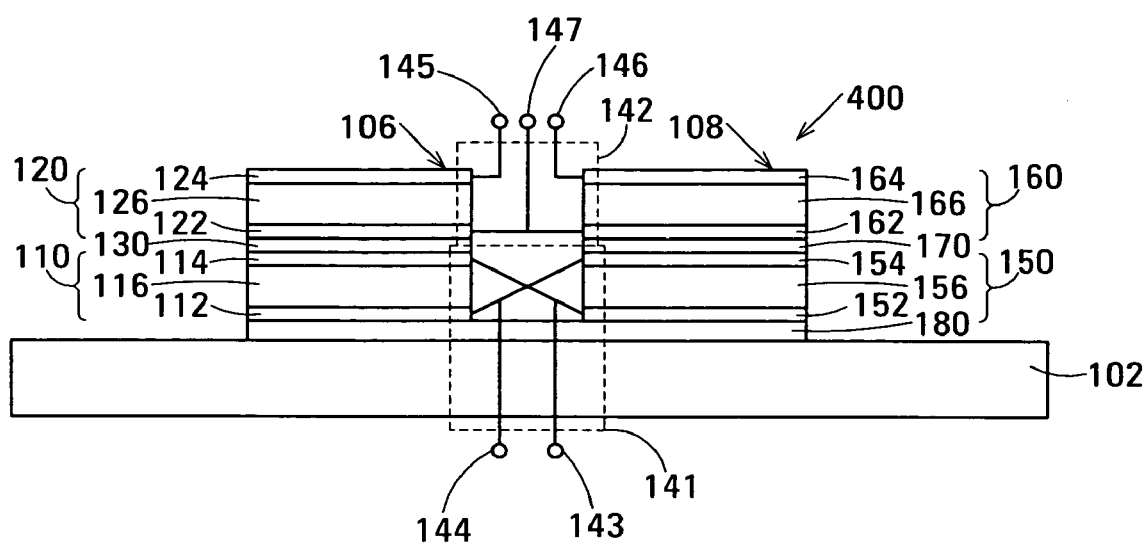
FIG. 6D is a schematic diagram of the electrical circuits of the fourth embodiment of an FBAR device in accordance with the invention.

FIG. 6A is a plan view of a fourth exemplary embodiment 400 of an FBAR device in accordance with the invention. FBAR device 400 is a film acoustically-coupled transformer (FACT) incorporating two decoupled stacked bulk acoustic resonators (DSBARs). FIGS. 6B and 6C are cross-sectional views along the section lines 6B—6B and 6C—6C, respectively, in FIG. 6A. FIG. 6D is a schematic drawing of the electrical circuits of the example of FACT 400 shown in FIG. 6A. The example of FBAR device 400 described below has an acoustic Bragg reflector similar in structure to acoustic Bragg reflector 180 described above with reference to FIG. 3B. The acoustic Bragg reflector may alternatively be structured as described above with reference to FIGS. 3C–3F. FBAR device 400 may alternatively incorporate an acoustic Bragg reflector similar to that described above with reference to FIG. 4.

FACT 400 has a substrate 102, decoupled stacked bulk acoustic resonators (DSBARs) 106 and 108 and acoustic Bragg reflector 180 located between the DSBARs and the substrate. Each DSBAR is composed of a lower film bulk acoustic resonator (FBAR), an upper FBAR and an acoustic decoupler between the FBARs. FACT 400 is additionally composed of an electrical circuit that interconnects the lower FBARs 110 and 150 of DSBARs 106 and 108, respectively, and an electrical circuit that interconnects the upper FBARs 120 and 160 of DSBARs 106 and 108, respectively. FIG. 6D shows an example in which an electrical circuit 141 connects the lower FBAR 110 of DSBAR 106 and the lower FBAR 150 of DSBAR 108 in anti-parallel, and an electrical circuit 142 connects the upper FBAR 120 of DSBAR 106 and the upper FBAR 160 of DSBAR 108 in series.

In DSBAR 106, lower FBAR 110 is composed of opposed planar electrodes 112 and 114 and a piezoelectric element 116 between the electrodes, and upper FBAR 120 is composed of opposed planar electrodes 122 and 124 and a piezoelectric element 126 between the electrodes. In DSBAR 108, lower FBAR 150 is composed of opposed planar electrodes 152 and 154 and a piezoelectric element 156 between the electrodes, and upper FBAR 160 is composed of opposed planar electrodes 162 and 164 and a piezoelectric element 166 between the electrodes.

In FACT 400, acoustic decoupler 130 of DSBAR 106 is located between lower FBAR 110 and upper FBAR 120; specifically, between electrode 114 of lower FBAR 110 and electrode 122 of upper FBAR 120. Acoustic decoupler 130 controls the coupling of acoustic energy between FBARs 110 and 120. Acoustic decoupler 130 couples less acoustic energy between the FBARs 110 and 120 than would be coupled if the FBARs were in direct contact with one another as they would be in a conventional stacked bulk acoustic resonator (SBAR). Additionally, acoustic decoupler 170 of DSBAR 108 is located between FBARs 150 and 160; specifically, between electrode 154 of lower FBAR 150 and electrode 162 of upper FBAR 160. Acoustic decoupler 170 controls the coupling of acoustic energy between FBARs 150 and 160. Acoustic decoupler 170 couples less acoustic energy between the FBARs 150 and 160 than would be coupled if the FBARs were in direct contact with one another. The coupling of acoustic energy defined by acoustic decouplers 130 and 170 determines the pass bandwidth of FACT 400.

In the example shown in FIGS. 6A–6C, acoustic decouplers 130 and 170 are respective parts of an acoustic decoupling layer 131. In other embodiments, acoustic decouplers 130 and 170 are each composed of acoustic decoupling layers of acoustic decoupling materials having different acoustic impedances, as described in the above-mentioned U.S. patent application Ser. No. 10/865,449 of John D. Larson et al., entitled Pass Bandwidth Control in Decoupled Stacked Bulk Acoustic Resonator Devices. In other embodiments, acoustic decouplers 130 and 170 are structurally independent.

Acoustic Bragg reflector 180 located between DSBARs 106 and 108 and substrate 102 acoustically isolates the DSBARs from the substrate. The structure of acoustic Bragg reflector 180 is described above with reference to FIG. 3B. The large acoustic impedance ratio between the metal of metal Bragg layers 182 and 186 and the plastic material of plastic Bragg layers 184 and 188 enables acoustic Bragg reflector 180 to present a very high effective impedance to DSBAR 106 and DSBAR 108. The large acoustic impedance ratio between acoustic Bragg reflector 180 and DSBARs 106 and 108 enables acoustic Bragg reflector 180 to provide sufficient acoustic isolation between DSBARs 106 and 108 and substrate 102 to allow FBARs 110 and 120 to resonate mechanically in response to an input electrical signal applied between the electrodes of one of them and to allow FBARs 150 and 160 to resonate mechanically in response to an input electrical signal applied between the electrodes of one of them. In each DSBAR, the acoustic energy generated in the FBAR that receives the input electrical signal passes through the respective acoustic decoupler 130 or 170 into the other FBAR. The FBAR receiving the acoustic energy converts part of the acoustic energy into an electrical output signal provided between its electrodes. The electrical signal output between the electrodes of the FBAR receiving the acoustic energy has a band-pass frequency response characteristic substantially free of undesirable spurious artifacts.

FIG. 6D schematically shows an example of the electrical circuits that interconnect DSBARs 106 and 108 and connect DSBARs 106 and 108 to external electrical circuits (not shown). Electrical circuit 141 connects lower FBARs 110 and 150 in anti-parallel and to signal terminal 143 and ground terminal 144. In the embodiment shown in FIGS. 6A–6C, terminal pad 138 provides signal terminal 143 and terminal pads 132 and 172 provide ground terminal 144. In the embodiment, electrical circuit 141 (FIG. 6D) is provided by an electrical trace 133 that extends from terminal pad 132 to electrode 112 of FBAR 110, an electrical trace 137 that extends from electrode 114 of FBAR 110 to an interconnection pad 136 in electrical contact with an interconnection pad 176, an electrical trace 139 that extends from interconnection pad 176 to signal pad 138, an electrical trace 177 that extends from interconnection pad 176 to electrode 152 of FBAR 150, an electrical trace 173 that extends from electrode 154 of FBAR 150 to terminal pad 172 and an electrical trace 167 that interconnects terminal pads 132 and 172.

In the exemplary electrical schematic shown in FIG. 6D, electrical circuit 142 connects upper FBARs 120 and 160 in series and to signal terminals 145 and 146 and to optional center-tap terminal 147. In the embodiment shown in FIGS. 6A–6C, terminal pads 134 and 174 provide signal pads 145 and 146 and terminal pad 178 provides center-tap terminal 147. In the embodiment, electrical circuit 142 is provided by an electrical trace 135 that extends from terminal pad 134 to electrode 124 of FBAR 120, an electrical trace 171 that extends from electrode 122 of FBAR 120 to electrode 162 of FBAR 160, an electrical trace 179 that extends from trace 171 to center-tap 137, and an electrical trace 175 that extends from electrode 164 of FBAR 160 to terminal pad 174. Also shown are terminal pads 163 and 168 interconnected by an electrical trace 169 that provide local grounds for terminal pads 134 and 174. In the example shown, electrical trace 169 additionally extends to terminal pad 178. In other examples, terminal pad 178 is left floating.

The electrical connections exemplified in FIG. 6D provide a FACT with a balanced primary and a 4:1 impedance transformation ratio or a FACT with a balanced secondary and a 1:4 impedance transformation ratio. The lower FBARs may alternatively be interconnected in parallel, series, and anti-series, and the upper FBARs may alternatively be interconnected in parallel, anti-parallel and anti-series to achieve other impedance transformation ratios as shown in Table 1 below.

TABLE 1

| | Parallel | Series | Anti-parallel. | Anti-series |
|---|---|---|---|---|
| Parallel | U 1:1 LOW | X | X | U 1:4 |
| Series | X | B 1:1 HI | B 4:1 | X |
| Anti-parallel. | X | B 1:4 | B 1:1 LOW | X |
| Anti-series | U 4:1 | X | X | U 1:1 HI |

In Table 1, the row captions indicate the configuration of electrical circuit 141, the column captions indicate the configuration of electrical circuit 142, B denotes that the FACT is electrically balanced, U denotes that the FACT is unbalanced, and X denotes a non-functioning FACT. The impedance transformation ratio shown is the impedance transformation from the configuration of electrical circuit 141 indicated by the row caption to the configuration of electrical circuit 142 indicated by the column caption. For the configurations having a 1:1 transformation ratio, LOW denotes that the FACT has a low impedance, equivalent to that of two FBARs in parallel, and HI indicates that the FACT has a high impedance, equivalent to that of two FBARs in series.

An alternative embodiment (not shown) has an acoustic Bragg reflector similar in structure to acoustic Bragg reflector 280 described above with reference to FIG. 4 instead of acoustic Bragg reflector 180. In such embodiment, second metal Bragg layer 186 and second plastic Bragg layer 188 are omitted, the order of first metal Bragg layer 182 and first plastic Bragg layer 184 is reversed, first metal Bragg layer 182 is patterned to define substrate-side electrodes 112 and 152, remote-side electrodes 114 and 154 are defined in a quarter-wave thick layer of metal and the thickness of piezoelectric elements 116 and 156 is defined to provide an overall phase change of $3\pi$ radians across FBARs 110 and 150. FBARs 120 and 160 are structured to have the same resonant frequency as FBARs 110 and 150.

Wafer-scale fabrication is used to fabricate thousands of FBAR devices similar to above-described FBAR devices 100, 200, 300 or 400 at the same time. Such wafer-scale fabrication makes the FBAR devices inexpensive to fabricate. An example of the fabrication method used to fabricate an embodiment of FBAR device 300 described above with reference to FIGS. 5A and 5B will be described next with reference to the plan views of FIGS. 7A–7K and the cross-sectional views of FIGS. 7L–7V. With different masks, the process can also be used to fabricate embodiments of FBAR devices 100, 200 and 400. Operations that are omitted to fabricate embodiments of FBAR devices 100 and 200 will be identified in the description below. The pass band of the embodiment of FBAR device 300 whose fabrication will be described has a nominal center frequency of about 1.9 GHz. Embodiments for operation at other frequencies are similar in structure and fabrication but have thicknesses and lateral dimensions different from those exemplified below. The example of FBAR device 300 whose fabrication will be described below has an acoustic Bragg reflector similar in structure to acoustic Bragg reflector 180 described above with reference to FIG. 3B. The described process can be modified to deposit fewer Bragg layers to fabricate acoustic Bragg reflectors structured as described above with reference to FIGS. 3C–3F.

A wafer of single-crystal silicon is provided. A portion of the wafer constitutes, for each FBAR device being fabricated, a substrate corresponding to the substrate 102 of FBAR device 300. FIGS. 7A–7K and FIGS. 7L–7V illustrate and the following description describes the fabrication of FBAR device 300 on a portion of the wafer. As FBAR device 300 is fabricated, the remaining FBAR devices on the wafer are similarly fabricated.

Figure 7A:
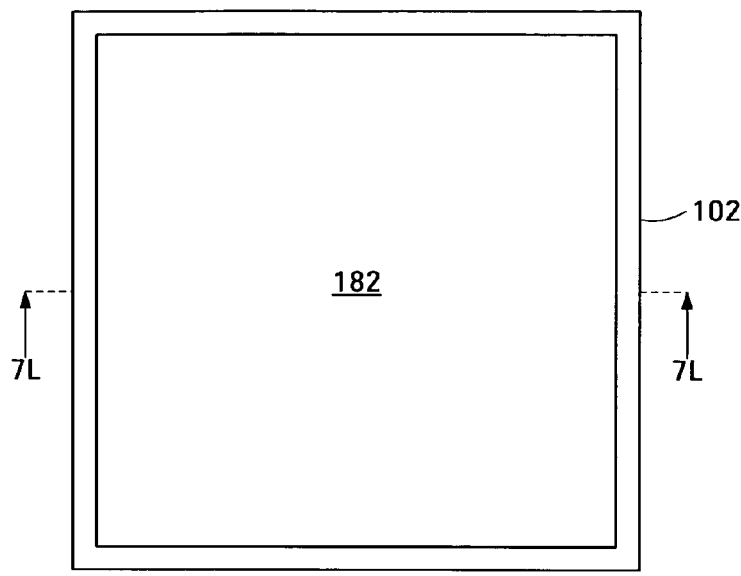
FIGS. 7A–7K are plan views illustrating a process for making an embodiment of an FBAR device in accordance with the invention.
Figure 7L:
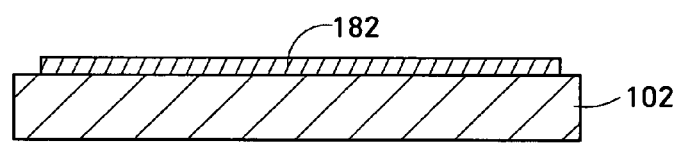
FIGS. 7L–7V are cross-sectional views along the section lines 7L—7L, 7M—7M, 7N—7N, 7O—7O, 7P—7P, 7Q—7Q, 7R—7R, 7S—7S 7T—7T, 7U—7U, and 7V—7V in FIGS. 7A–7K, respectively.

A first metal layer is deposited on the surface of substrate 102 and is patterned to define first metal Bragg layer 182, as shown in FIGS. 7A and 7L.

In one embodiment, the first metal layer and the second metal layer whose deposition will be described below were respective layers of molybdenum each deposited to a thickness of about 800 nm by sputtering. In another embodiment with three or more Bragg layers, the thickness of the first metal layer and the second metal layer was 300 nm. The first and second metal layers were patterned by dry etching. Each metal Bragg layer is patterned to inset its sides from the sides of substrate 102.

Figure 7B:
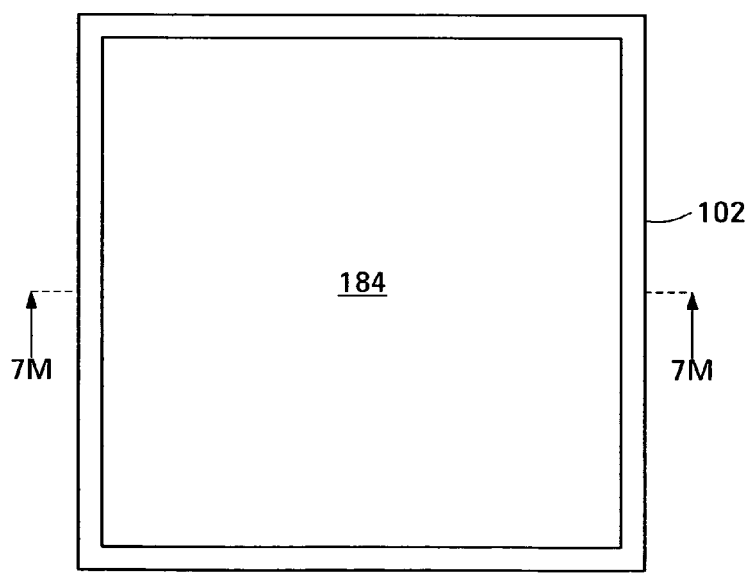
Figure 7M:
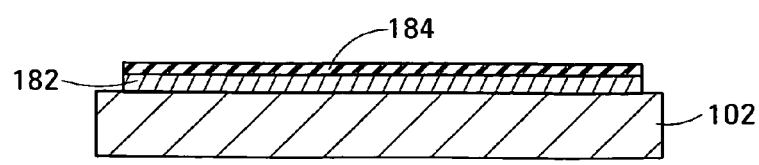
Figure 7C:
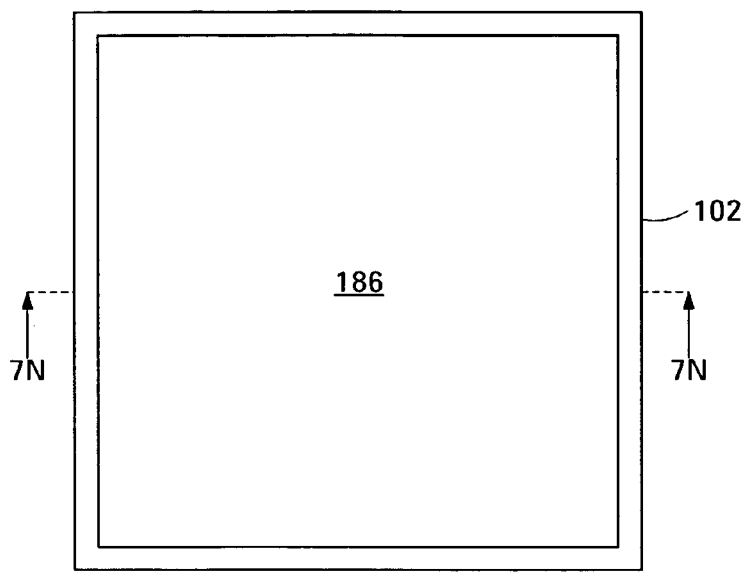
Figure 7N:
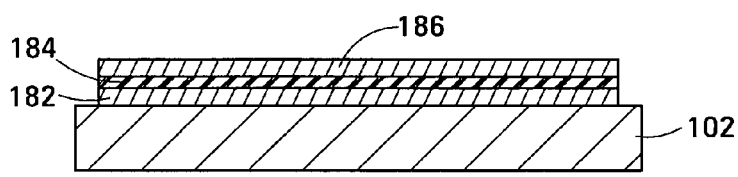
Figure 7D:
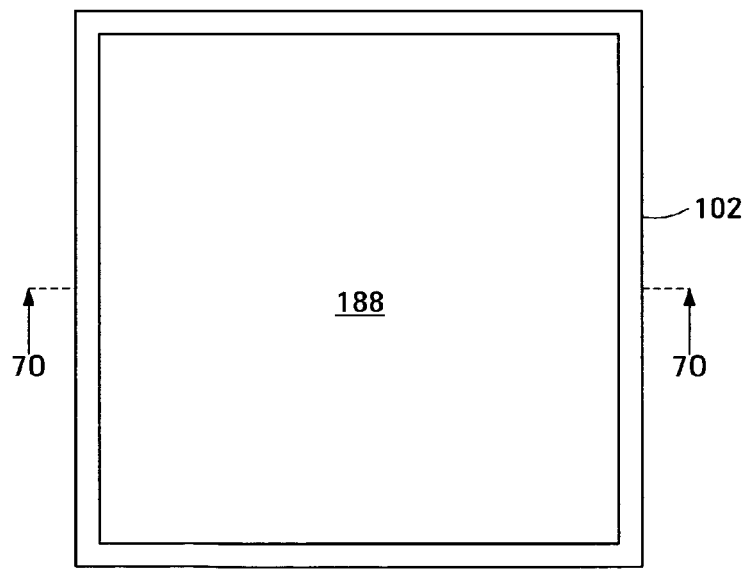
Figure 7O:
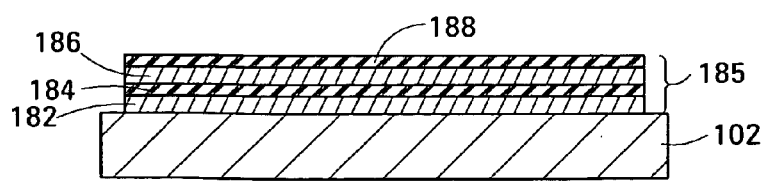

A first layer of plastic material is deposited on the major surface of the first metal layer and is patterned to define first plastic Bragg layer 184, as shown in FIGS. 7B and 7M.

In one embodiment, the first layer of plastic material and the second layer of plastic material whose deposition will be described below were respective layers of polyimide each with a thickness of about 200 nm, i.e., one quarter of the center frequency wavelength in the polyimide. Each of the first layer of plastic and the second layer of plastic was spun onto first metal Bragg layer 182 and second metal Bragg layer 186, respectively, and was cured to form a layer. After each deposition, the wafer was baked initially at a temperature of about 250° C. in air and finally at a temperature of about 415° C. in an inert atmosphere, such as a nitrogen atmosphere, before further processing was performed. The bake evaporates volatile constituents of the polyimide and prevents the evaporation of such volatile constituents during subsequent processing from causing separation of subsequently-deposited layers. Each layer of plastic was then patterned to define the respective plastic Bragg layer. Polyimide is patterned by photolithography. Polyimide is photosensitive so that no photoresist is needed. Each plastic Bragg layer is patterned to inset its sides from the sides of substrate 102.

In another embodiment, the plastic material deposited to form each of the first plastic layer and the second plastic layer was parylene deposited by vacuum deposition from the dimer precursor di-para-xylylene. The first plastic layer and the second plastic layer were each patterned the respective plastic Bragg layer as described below with respect to patterning a layer of a crosslinked polyphenylene polymer to define acoustic decoupler 130.

In another embodiment, a precursor solution for the crosslinked polyphenylene polymer was spun on to form each of the first plastic layer and the second plastic layer with a thickness of about 187 nm, i.e., one quarter of the center frequency wavelength in the crosslinked polyphenylene polymer. In an example, the precursor solution for the crosslinked polyphenylene polymer was one sold by The Dow Chemical Company and designated SiLK™ J. Alternatively, the precursor solution may be any suitable one of the precursor solutions sold by The Dow Chemical Company under the trademark SiLK. In certain embodiments, a layer of an adhesion promoter was deposited before the precursor solution was spun on. Precursor solutions containing oligomers that, when cured, form a crosslinked polyphenylene polymer having an acoustic impedance of about 2 Mrayl may be available from other suppliers now or in the future and may also be used. The wafer is then baked at a temperature in the range from about 385° C. to about 450° C. in an inert ambient, such as under vacuum or in a nitrogen atmosphere, before further processing is performed. The bake first drives off the organic solvents from the precursor solution, and then causes the oligomer to cross link as described above to form the crosslinked polyphenylene polymer. The first plastic layer and the second plastic layer were each patterned as described below to define the respective plastic Bragg layer.

The second metal layer is deposited on the surface of first plastic Bragg layer 184 and is patterned to define second metal Bragg layer 186, as described above and shown in FIGS. 7C and 7N.

The above-described second layer of plastic material is deposited on the surface of second metal Bragg layer 186 and is patterned to form second plastic Bragg layer 188, as described above shown in FIGS. 7D and 7O. Deposition of the second layer of plastic material and patterning the second layer of plastic to define second plastic Bragg layer 188 completes the fabrication of acoustic Bragg reflector 180.

In fabrication environments whose design rules require terminal pads 132, 134 and 138 (FIG. 5A) to be located on the surface of substrate 102 rather than on the surface of a layer deposited on the substrate, the above-described patterning of each of the Bragg layers whose deposition is described above additionally defines windows in the locations of terminal pads 132, 134 and 138. The windows provide access to the surface of substrate 102.

Figure 7E:
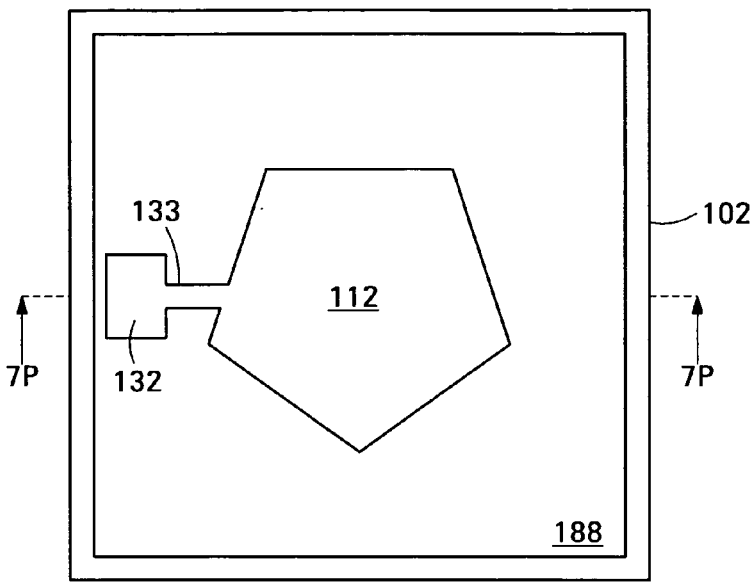
Figure 7P:
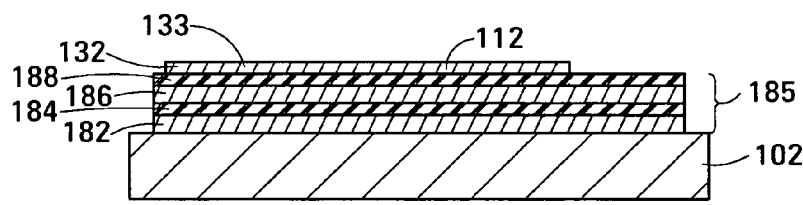

A third metal layer is deposited on the surface of second plastic Bragg layer 188 and is patterned to define electrode 112, terminal pad 132 and electrical trace 133 extending between electrode 112 and terminal pad 132, as shown in FIGS. 7E and 7P.

Electrode 112 typically has an asymmetrical shape in a plane parallel to the major surface of the wafer. An asymmetrical electrode shape minimizes lateral modes in the FBAR of which it forms part, as described in U.S. Pat. No. 6,215,375 of Larson III et al., the disclosure of which is incorporated into this disclosure by reference.

Referring additionally to FIG. 5B, electrode 114 is defined in a fourth metal layer, electrode 122 is defined in a fifth metal layer and electrode 124 is defined in a sixth metal layer, as will be described in detail below. The metal layers in which the electrodes are defined are patterned such that, in respective planes parallel to the major surface of the wafer, electrodes 112 and 114 of FBAR 110 have the same shape, size, orientation and position and electrodes 122 and 124 of FBAR 120 have the same shape, size, orientation and position. Typically, electrodes 114 and 122 additionally have the same shape, size, orientation and position.

In an embodiment, the material of each of the metal layers was molybdenum deposited by sputtering. The metal layers were each patterned by dry etching. The electrodes defined in each of the third through sixth metal layers were pentagonal each with an area of about 12,000 square µm and a thickness of about 300 nm. Other electrode areas give other characteristic impedances.

Other refractory metals such as tungsten, niobium and titanium may alternatively be used as the material of the first through sixth metal layers. The metal layers may each alternatively comprise layers of more than one material. One factor to be considered in choosing the material of the electrodes and metal Bragg layers of FBAR device 300 is the acoustic properties of the material of the electrodes and the metal Bragg layers: the acoustic properties of the material(s) of the remaining metal parts of FBAR device 300 are less important than other properties such as electrical conductivity. Thus, material(s) of the remaining metal parts of FBAR device 300 may be different from the material of the electrodes and the metal Bragg layers.

Figure 7F:
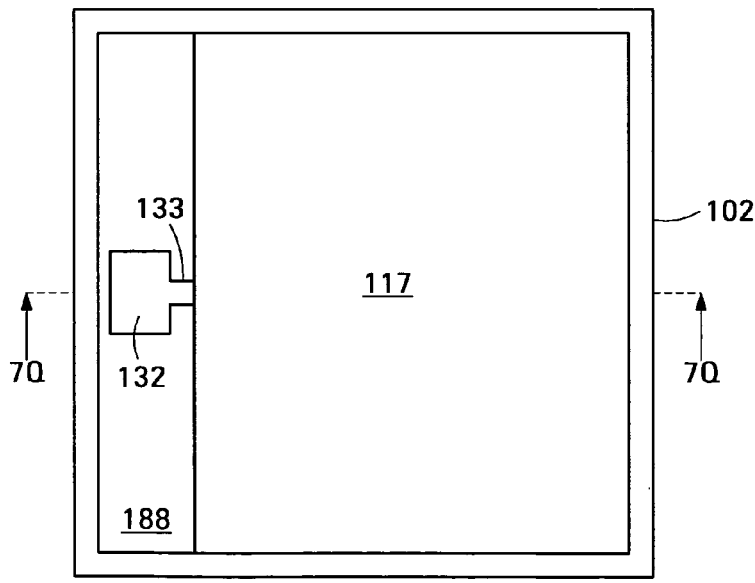
Figure 7Q:
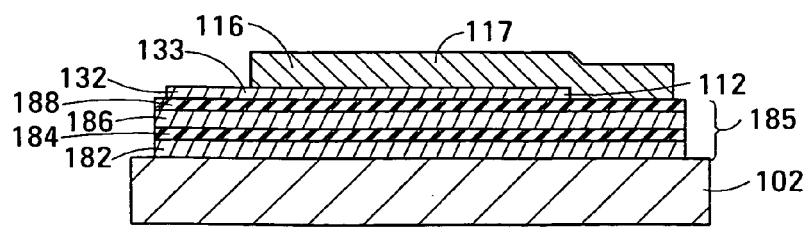

A first piezoelectric layer 117 of piezoelectric material is deposited and is patterned to define piezoelectric element 116 as shown in FIGS. 7F and 7Q. First piezoelectric layer 117 is patterned to expose terminal pad 132 connected to electrode 112.

In an embodiment, the piezoelectric material deposited to form first piezoelectric layer 117 and second piezoelectric layer 127 described below was aluminum nitride and was deposited with a thickness of about 1.4 µm by sputtering. The piezoelectric material was patterned by wet etching in potassium hydroxide or by chlorine-based dry etching. Alternative materials for piezoelectric layers 117 and 127 include zinc oxide, cadmium sulfide and poled ferroelectric materials such as perovskite ferroelectric materials, including lead zirconium titanate, lead meta niobate and barium titanate.

Figure 7G:
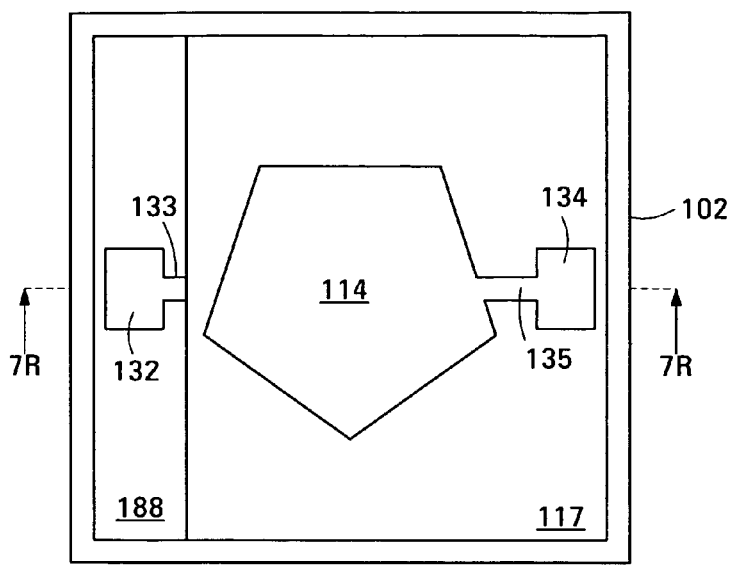
Figure 7R:
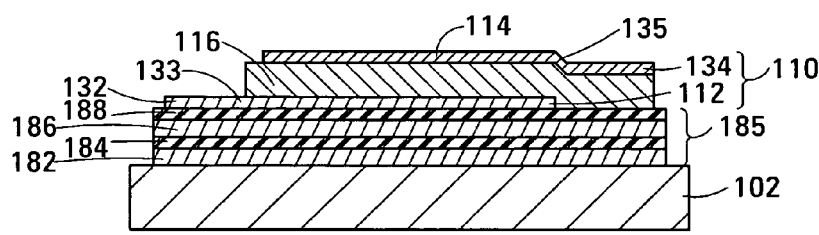

The fourth metal layer is deposited and is patterned to define electrode 114, terminal pad 134 and electrical trace 135 extending between electrode 114 and terminal pad 134, as shown in FIGS. 7G and 7R.

Figure 7H:
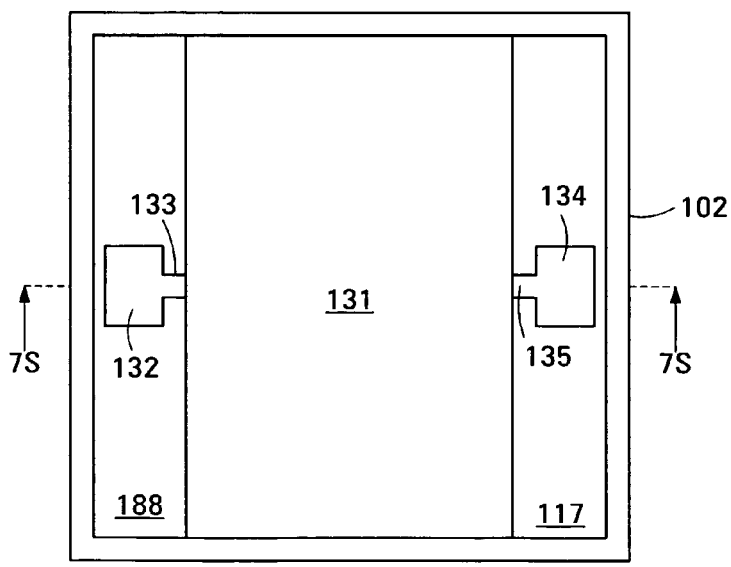
Figure 7S:
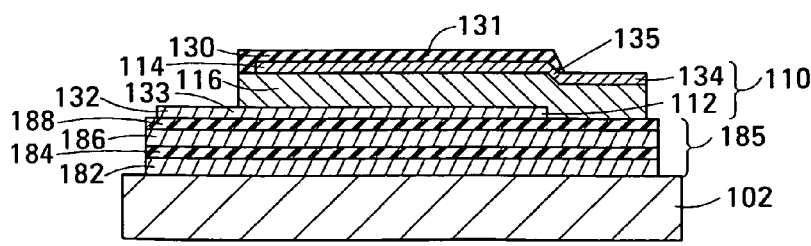

A layer of acoustic decoupling material is then deposited and is patterned to define acoustic decoupler 130, as shown in FIGS. 7H and 7S. Acoustic decoupler 130 is patterned to cover at least electrode 114, and is additionally patterned to expose terminal pads 132 and 134. Acoustic decoupling layer 131 is typically a third quarter-wave layer of plastic material. This operation is omitted in the fabrication of FBAR device 100.

In an embodiment, the acoustic decoupling material of acoustic decoupling layer 131 was polyimide with a thickness of about 200 nm, i.e., one quarter of the center frequency wavelength in the polyimide. The polyimide was deposited by spin coating, and was patterned by photolithography. Polyimide is photosensitive so that no photoresist is needed. As noted above, other plastic materials can be used as the acoustic decoupling material. The acoustic decoupling material can be deposited by methods other than spin coating.

In an embodiment in which the acoustic decoupling material was polyimide, after depositing and patterning the polyimide, the wafer was baked as described above to evaporate the volatile constituents of the polyimide and prevent the evaporation of such volatile constituents during subsequent processing from causing separation of subsequently-deposited layers.

Figure 7I:
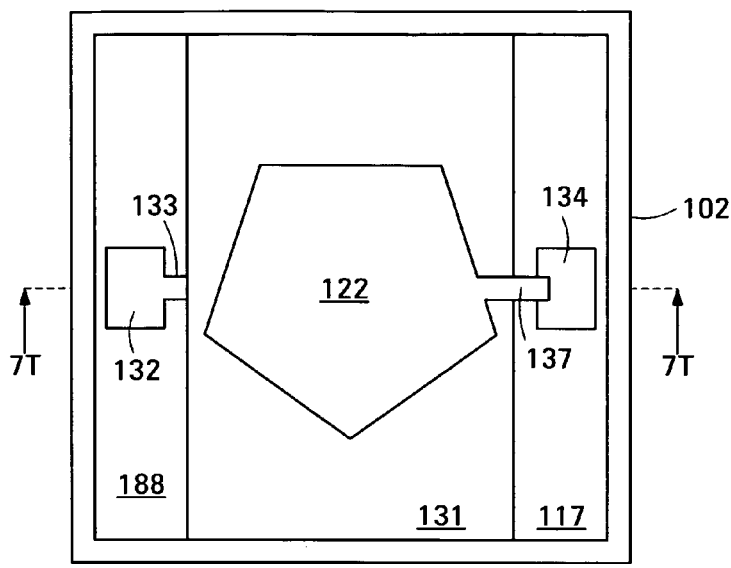
Figure 7T:
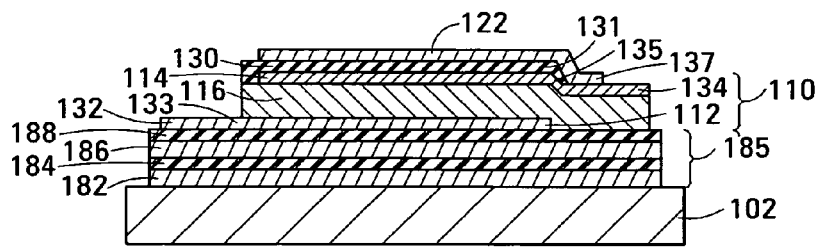

The fifth metal layer is deposited and is patterned to define electrode 122 and electrical trace 137 extending from electrode 122 to terminal pad 134, as shown in FIGS. 7I and 7T.

Terminal pad 134 is also electrically connected to electrode 114 by trace 135. This operation is omitted in the fabrication of FBAR device 100.

Figure 7J:
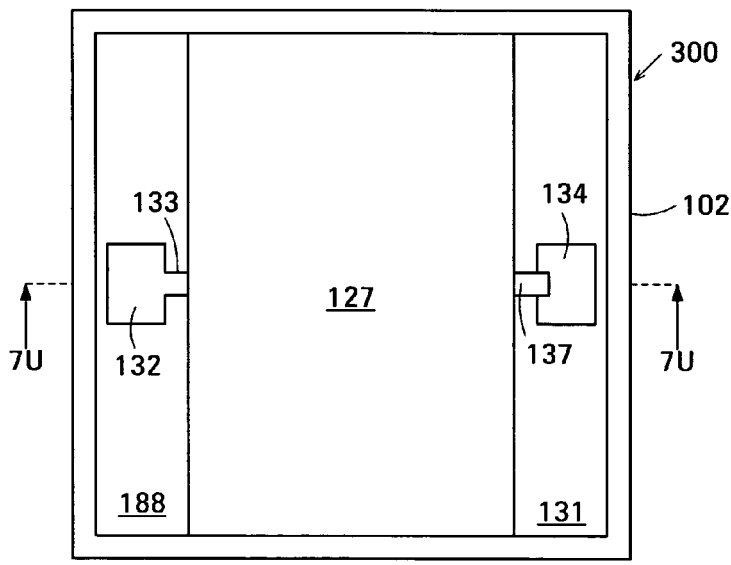
Figure 7U:
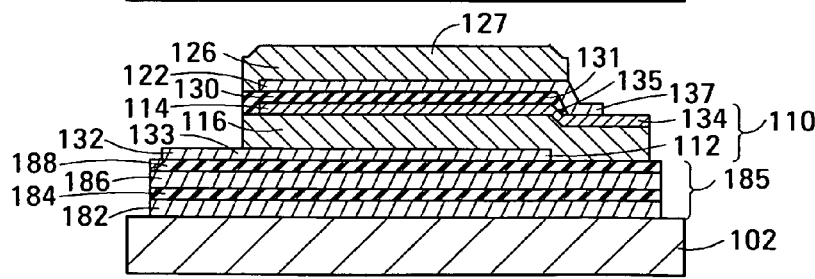

A second layer 127 of piezoelectric material is deposited and is patterned to define piezoelectric element 126. Piezoelectric layer 127 is patterned to expose terminal pads 132 and 134, as shown in FIGS. 7J and 7U. This operation is omitted in the fabrication of FBAR devices 100.

Figure 7K:
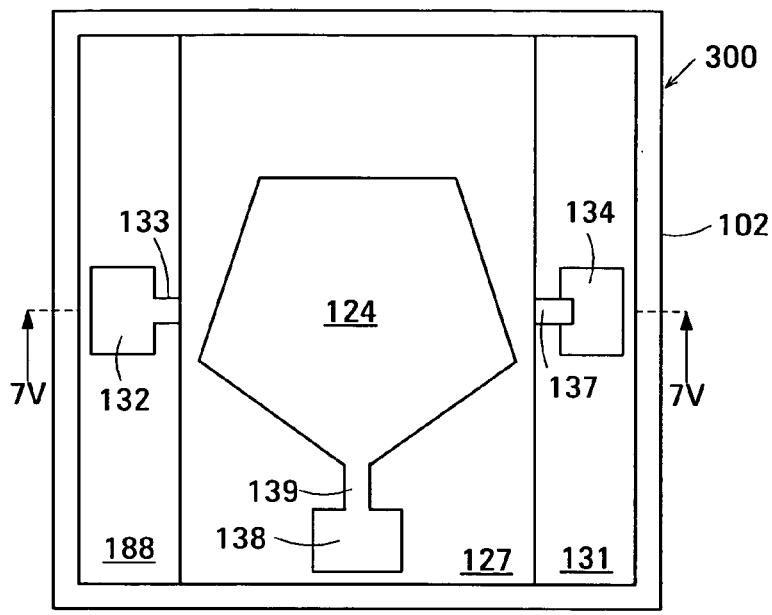
Figure 7V:
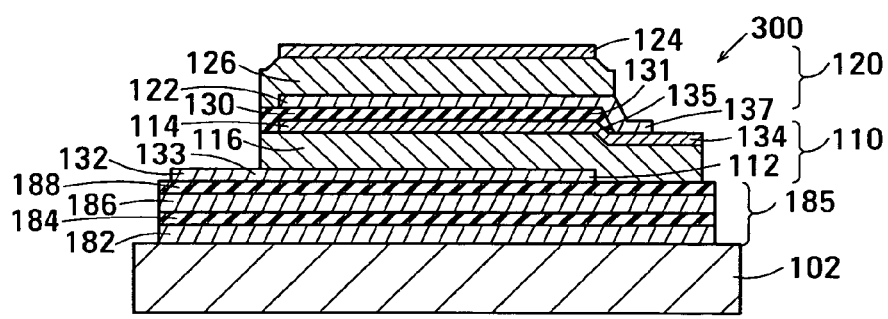

The sixth metal layer is deposited and is patterned to define electrode 124, terminal pad 138 and electrical trace 139 extending from electrode 124 to terminal pad 138, as shown in FIGS. 7K and 7V. This operation is omitted in the fabrication of FBAR device 100.

A gold protective layer is deposited on the exposed surfaces of terminal pads 132, 134 and 138.

The wafer is then divided into individual FBAR devices, including FBAR device 300. Each FBAR device is mounted in a package and electrical connections are made between terminal pads 132, 134 and 138 of the FBAR device and pads that are part of the package.

As noted above, an alternative acoustic decoupling layer of acoustic decoupling material of acoustic decoupling layer 131 is a crosslinked polyphenylene polymer. After the fourth metal layer has been patterned to define electrode 114, as described above with reference to FIGS. 7G and 7R, the precursor solution for the crosslinked polyphenylene polymer is spun on in a manner similar to that described above with reference to FIGS. 7H and 7T, but is not patterned. The formulation of the precursor solution and the spin speed are selected so that the crosslinked polyphenylene polymer forms a layer with a thickness of about 187 nm. This corresponds to one quarter of the wavelength $\lambda_n$ in the crosslinked polyphenylene polymer of an acoustic signal having a frequency equal to the center frequency of the pass band of FBAR device 300. The wafer is then baked at a temperature in the range from about 385° C. to about 450° C. in an inert ambient, such as under vacuum or in a nitrogen atmosphere, before further processing is performed. The bake first drives off the organic solvents from the precursor solution, and then causes the oligomer to cross link as described above to form the crosslinked polyphenylene polymer.

The fifth metal layer is then deposited on the layer of the crosslinked polyphenylene polymer in a manner similar to that described above with reference to FIGS. 7I and 7T, but is initially patterned similarly to the patterning of acoustic decoupling layer 131 shown in FIG. 7H to define a hard mask that will later be used to pattern the layer of the crosslinked polyphenylene polymer to define acoustic decoupling layer. The initially-patterned fifth metal layer has the same extent as acoustic decoupling layer 131 and exposes terminal pads 132 and 134.

The layer of the crosslinked polyphenylene polymer is then patterned as shown in FIG. 7H with the initially-patterned fifth metal layer being used as a hard etch mask. Patterning the layer of the crosslinked polyphenylene polymer defines the extent of acoustic decoupling layer, which exposes terminal pads 132 and 134. The patterning is performed with an oxygen plasma etch.

The fifth metal layer is then re-patterned as shown in FIGS. 7I and 7T to define electrode 122 and electrical trace 137 extending between electrode 122 and terminal pad 134.

Fabrication of the embodiment of FBAR device 300 with a layer of a crosslinked polyphenylene polymer as its acoustic decoupler is completed by performing the processing described above with reference to FIGS. 7J, 7K, 7U and 7V.

In embodiments in which first plastic Bragg layer 184 and second plastic Bragg layer 188 are layers of a crosslinked polyphenylene polymer or of parylene, the plastic Bragg layers can be patterned using a similar process. The second metal layer in which second metal Bragg layer 186 is defined is initially patterned to define first plastic Bragg layer 184 in the first layer of plastic, and the third metal layer in which electrode 112 is defined is initially patterned to define second plastic Bragg layer 188 in the second layer of plastic.

In the fabrication of FBAR device 200 and other FBAR devices in which the acoustic Bragg reflector has no more than one plastic Bragg layer, deposition order of the first layer of plastic and first metal layer is reversed. The first layer of plastic material is deposited on the major surface of substrate 102 before the first metal layer is deposited on the first layer of plastic. The first metal layer is then patterned to define electrode 112, terminal pad 132 and electrical trace 133 extending between electrode 112 and terminal pad 132, as described above with reference to FIGS. 7E and 7P. Further, deposition of the second metal layer and the third metal layer is omitted. The metal layers are deposited to a thickness of 800 nm, which corresponds to the quarter-wave thickness. The piezoelectric layers are deposited to a thickness that provides the desired resonant frequency.

Figure 8A:
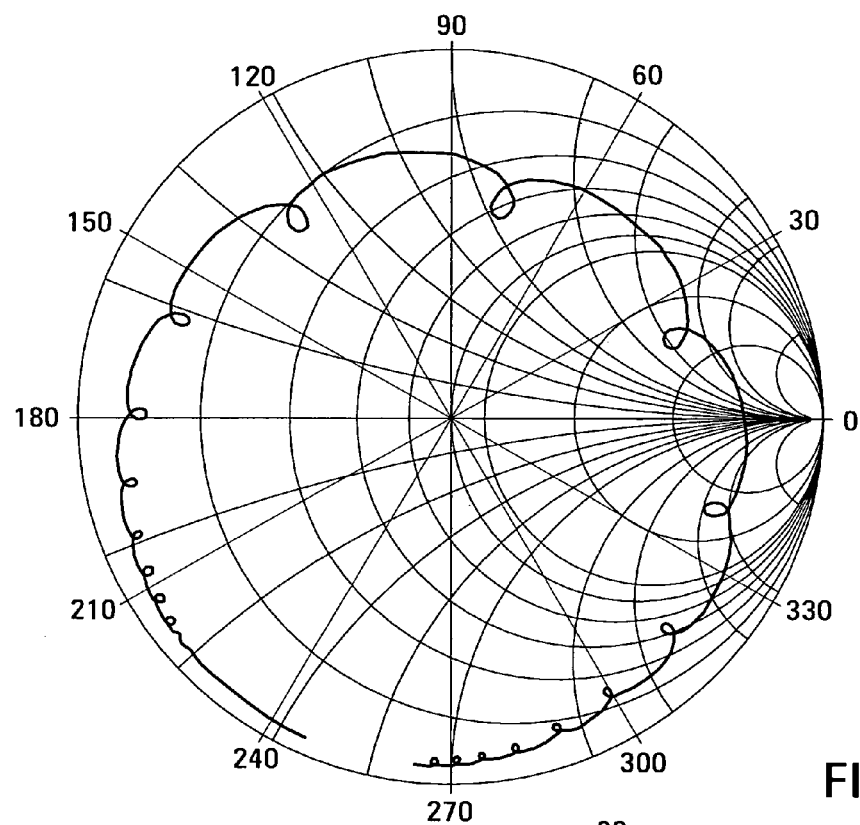
FIGS. 8A and 8B are Smith charts showing the reflection coefficient vector of a first test structure and a second test structure, respectively, embodying the invention over a frequency range from about 1.7 GHz to 2.1 GHz

FIG. 8A is a Smith chart showing the reflection coefficient vector of a first test structure over a frequency range from about 1.7 GHz to 2.1 GHz. The first test structure is similar to the embodiment of FBAR device 100 shown in FIG. 3D in which FBAR 110 was composed of two 440 nm-thick molybdenum electrodes and a 760 nm-thick piezoelectric element of aluminum nitride between the electrodes, and acoustic Bragg reflector 183 was composed of a 440 nm-thick (about $\lambda_n/8$) layer of molybdenum as first metal Bragg layer 182 and an 800 nm-thick (about $3\lambda_n/4$) layer of polyimide as first plastic Bragg layer 184. The chart exhibits multiple spurious artifacts due to acoustic coupling between the FBAR and the substrate.

Figure 8B:
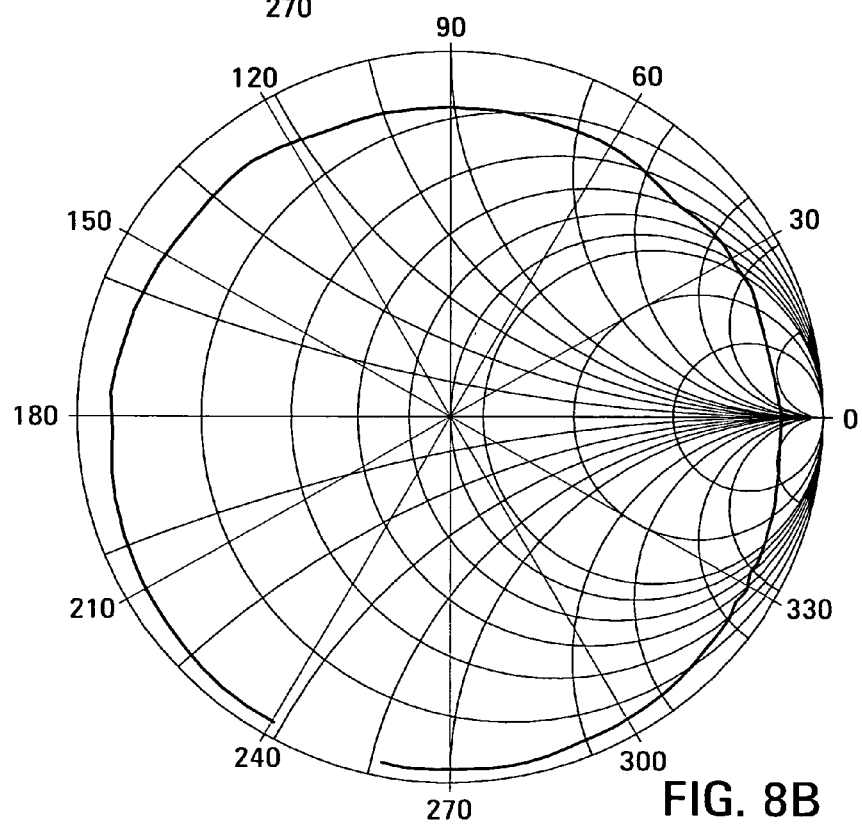

FIG. 8B is a Smith chart showing the reflection coefficient vector of a second test structure over the above frequency range. The second test structure is similar to the embodiment of FBAR device 100 shown in FIG. 3E in which FBAR 110 was composed of two 220 nm-thick molybdenum electrodes and a 1.5 µm-thick piezoelectric element of aluminum nitride between the electrodes, and acoustic Bragg reflector 185 was composed of a 220 nm-thick (about $\lambda_n/4$) layer of polyimide as first plastic Bragg layer 184, a 225 nm-thick layer of molybdenum (about $\lambda_n/16$) as first metal Bragg layer 182, and a 220 nm thick layer of polyimide as second plastic Bragg layer 188. The chart is almost free of spurious artifacts, which demonstrates that acoustic Bragg reflector 185 provides adequate acoustic isolation notwithstanding first metal Bragg layer 182 having a thickness substantially less than quarter-wave thickness.

This disclosure describes the invention in detail using illustrative embodiments. However, the invention defined by the appended claims is not limited to the precise embodiments described.

We claim:

1. A film bulk acoustic resonator (FBAR) device, comprising: a substrate; an acoustic Bragg reflector over the substrate, the acoustic Bragg reflector comprising a metal Bragg layer and a plastic Bragg layer juxtaposed with the metal Bragg layer; a piezoelectric element over the acoustic Bragg reflector; and a remote-side electrode over the piezoelectric element wherein: the FBAR device has a band-pass characteristic having a center frequency; at least one of the Bragg layers has a nominal thickness equal to one quarter of the wavelength in the material of the respective Bragg layer of an acoustic signal equal in frequency to the center frequency; and the metal Bragg layer is thinner than the nominal thickness.

2. The FBAR device of claim 1, in which the metal Bragg layer is patterned to define a substrate-side electrode.

3. The FBAR device of claim 2, in which: the substrate-side electrode, the piezoelectric element and the remote-side electrode collectively comprise a lower FBAR; and the FBAR device additionally comprises: an upper FBAR stacked on the lower FBAR, the upper FBAR comprising opposed planar electrodes and a piezoelectric element between the electrodes, and an acoustic decoupler between the FBARs.

4. The FBAR device of claim 3, in which: the lower FBAR, the upper FBAR and the acoustic decoupler comprise a first decoupled stacked bulk acoustic resonator (DSBAR); and the FBAR device additionally comprises: a second DSBAR over the plastic Bragg layer, the second DSBAR comprising a lower FBAR, an upper FBAR and an acoustic decoupler between the FBARs, and a first electrical circuit interconnecting the lower FBARs, and a second electrical circuit interconnecting the upper FBARs.

5. The FBAR device of claim 1, in which the plastic Bragg layer comprises polyimide.

6. The FBAR device of claim 1, in which the plastic Bragg layer comprises parylene.

7. The FBAR device of claim 1, in which the plastic Bragg layer comprises a crosslinked polyphenylene polymer.

8. The FBAR device of claim 7, in which the crosslinked polyphenylene polymer is formed from a precursor solution.

9. The FBAR device of claim 1, in which the metal Bragg layer comprises a refractory metal.

10. The FBAR device of claim 1, in which the acoustic Bragg reflector has sides inset from the sides of the substrate.

11. The FBAR device of claim 1, additionally comprising a substrate-side electrode between the acoustic Bragg reflector and the piezoelectric element.

12. The FBAR device of claim 11, in which: the substrate-side electrode, the piezoelectric element and the remote-side electrode collectively comprise a lower FBAR; and the FBAR device additionally comprises: an upper FBAR stacked on the lower FBAR, the upper FBAR comprising opposed planar electrodes and a piezoelectric element between the electrodes, and an acoustic decoupler between the FBARs.

13. The FBAR device of claim 12, in which: the lower FBAR, the upper FBAR and the acoustic decoupler constitute a first decoupled stacked bulk acoustic resonator (DSBAR); and the FBAR device additionally comprises: a second DSBAR over the acoustic Bragg reflector, the second DSBAR comprising a lower FBAR, an upper FBAR and an acoustic decoupler between the FBARs, and a first electrical circuit interconnecting the lower FBARs, and a second electrical circuit interconnecting the upper FBARs.

14. The FBAR device of claim 11 in which at least one of the plastic Bragg layers comprises polyimide.

15. The FBAR device of claim 11, in which at least one of the plastic Bragg layers comprises parylene.

16. The FBAR device of claim 11, in which at least one of the plastic Bragg layer comprises a crosslinked polyphenylene polymer.

17. The FBAR device of claim 16, in which the crosslinked polyphenylene polymer is formed from a precursor solution.

18. The FBAR device of claim 11, in which the metal Bragg layer comprises a refractory metal.

19. The FBAR device of claim 11, in which: the metal Bragg layer is a first metal Bragg layer; the acoustic Bragg reflector additionally comprises a second metal Bragg layer juxtaposed with the plastic Bragg layer.

20. The FBAR device of claim 19, in which: the plastic Bragg layer is a first plastic Bragg layer; and the acoustic Bragg reflector additionally comprises a second plastic Bragg layer juxtaposed with the first metal Bragg layer.

21. The FBAR device of claim 11, in which: the plastic Bragg layer is a first plastic Bragg layer; the acoustic Bragg reflector additionally comprises a second plastic Bragg layer juxtaposed with the metal Bragg layer.

22. A film bulk acoustic resonator (FBAR) device, comprising: a substrate; an acoustic Bragg reflector over the substrate, the acoustic Bragg reflector comprising a first Bragg layer and a second Bragg layer juxtaposed with the first Bragg layer, the first Bragg layer comprising a first material having an acoustic impedance less than five Mrayl, the second Bragg layer comprising a second material having an acoustic impedance greater than 50 Mrayl; a piezoelectric element over the acoustic Bragg reflector; and a remote-side electrode over the piezoelectric element, wherein: the FBAR device has a band-pass characteristic having a center frequency; at least one of the Bragg layers has a nominal thickness equal to one quarter of the wavelength in the material of the respective Bragg layer of an acoustic signal equal in frequency to the center frequency; and the metal Bragg layer is thinner than the nominal thickness.

23. The FBAR device of claim 22, in which the one of the Bragg layers is patterned to define a substrate-side electrode.

24. The FBAR device of claim 22, additionally comprising a substrate-side electrode between the acoustic Bragg reflector and the piezoelectric element.

25. The FBAR device of claim 22, in which: the first material has an acoustic impedance less than three; and the second material has an acoustic impedance greater than 60 Mrayl.

26. A film bulk acoustic resonator (FBAR) device, comprising: a substrate; an acoustic Bragg reflector over the substrate, the acoustic Bragg reflector comprising a first Bragg layer and a second Bragg layer juxtaposed with the first Bragg layer, the first Bragg layer comprising a first material having a first acoustic impedance, the second Bragg layer comprising a second material having a second acoustic impedance, the second acoustic impedance and the first acoustic impedance having a ratio greater than ten; a piezoelectric element over the second Bragg layer; and a remote-side electrode over the piezoelectric element, wherein: the FBAR device has a band-pass characteristic having a center frequency; at least one of the Bragg layers has a nominal thickness equal to one quarter of the wavelength in the material of the respective Bragg layer of an acoustic signal equal in frequency to the center frequency; and the metal Bragg layer is thinner than the nominal thickness.

27. The FBAR device of claim 26, in which one of the Bragg layers is patterned to define a substrate-side electrode.

28. The FBAR device of claim 26, additionally comprising a substrate-side electrode between the third Bragg layer and the piezoelectric element.

29. The FBAR device of claim 26, in which the second acoustic impedance and the first acoustic impedance have a ratio greater than 16.

* * * * *